United States Patent
Zheng et al.

(10) Patent No.: US 7,288,329 B2
(45) Date of Patent: Oct. 30, 2007

(54) ELECTROLUMINESCENT DEVICES INCLUDING CONJUGATED POLYMERS CONTAINING AN AZOLE STRUCTURE

(75) Inventors: Shiying Zheng, Webster, NY (US); Kathleen M. Vaeth, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 296 days.

(21) Appl. No.: 10/786,811

(22) Filed: Feb. 25, 2004

(65) Prior Publication Data

US 2005/0186445 A1    Aug. 25, 2005

(51) Int. Cl.
*H01L 51/50* (2006.01)
*B05D 5/12* (2006.01)

(52) U.S. Cl. .................. 428/690; 428/917; 313/504; 313/506; 427/66; 257/40

(58) Field of Classification Search ................ 428/690, 428/917; 313/504, 506; 257/40; 427/66
See application file for complete search history.

(56) References Cited

U.S. PATENT DOCUMENTS

| | | | |
|---|---|---|---|
| 6,803,124 B2 * | 10/2004 | Taguchi ................. | 428/690 |
| 6,821,649 B2 * | 11/2004 | Kambe et al. ........... | 428/690 |
| 7,090,929 B2 * | 8/2006 | Herron et al. .......... | 428/690 |
| 2002/0027623 A1 * | 3/2002 | Doi et al. .............. | 349/69 |
| 2002/0193532 A1 * | 12/2002 | Ikehira et al. .......... | 525/333.3 |
| 2003/0091862 A1 * | 5/2003 | Tokito et al. ........... | 428/690 |
| 2004/0108807 A1 * | 6/2004 | Park .................... | 313/504 |

FOREIGN PATENT DOCUMENTS

JP    2000087027 A  *  3/2000

OTHER PUBLICATIONS

Peng et al., Chemtech, 29(5), p. 41-46, 1999.*
Lee et al., Chem. Materials, 2001, 13, p. 565-574.*
Burroughes et al, Light-emitting diodes based on conjugated polymers, Nature, 1990, 347, 539-41.
Bernius et al, Progress with Light-Emitting Polymers, Adv. Mater. 2000, 12, 1737-1750.
Zhang et al, Blue emission from polymer light-emitting diodes using non-conjugated polymer blends with air-stable electrodes, Synth. Met. 1995, 72, 185-188.
Berggren et al, Ultraviolet Electroluminescence from an Organic Light Emitting Diode, Adv. Mater. 1995, 7, 900-903.
Yang et al, 1,3,4-Oxadiazole-Containing Polymers as Electron-Injection and Blue Electroluminescent Materials in Polymer Light-Emitting Diodes, Chem. Mater., 1995, 7, 1568-1575.
Suzuki et al, The Palladium-Catalyzed Cross-Coupling Reaction of Phenylboronic Acid With Haloarenes in the Presence of Bases, Synthetic Comm. 1981, 11(7), 513-519.
Ritter, Synthetic Transformation of Vinyl and Aryl Triflates, Synthesis, 1993, 735-762.
Yang et al, Polyaniline as a transparent electrode for polymer light-emitting diodes: Lower operataing voltage and higher efficiency, Appl. Phys. Lett. 1994, 64, 1245-1247.
Groenedaal et al, Poly(3,4-ethylenedioxythiophene) and Its Derivatives: Past, Present and Future, Adv. Mater. 2000, 12, 481-494.
Ranger et al, New Well-Defined Poly (2,7-fluorene) Derivatives: Photoluminescence and Base Doping, Macromolecules 1997, 30, 7686-7691.

* cited by examiner

*Primary Examiner*—Dawn Garrett
(74) *Attorney, Agent, or Firm*—Raymond L. Owens

(57) ABSTRACT

An electroluminescent device, including a spaced-apart anode and cathode; and an organic layer disposed between the spaced-apart anode and cathode and including a polymer having an azole structure.

7 Claims, 2 Drawing Sheets

ELECTROLUMINESCENT DEVICES INCLUDING CONJUGATED POLYMERS CONTAINING AN AZOLE STRUCTURE

FIELD OF THE INVENTION

The present invention relates to conjugated polymers containing an azole structure for use in electroluminescent (EL) devices.

BACKGROUND OF THE INVENTION

Electroluminescent devices are opto-electonic devices where light emission is produced in response to an electrical current through the device. The physical model for EL is the radiative recombination of electrons and holes. The term light emitting diode (LED) is commonly used to describe an EL device where the current-voltage behavior is non-linear, meaning that the current through the EL device is dependent on the polarity of the voltage applied to the EL device. Both organic and inorganic materials have been used for the fabrication of LEDs. Inorganic materials such as ZnS/Sn, Ga/Bs, Ga/As have been used in semiconductor lasers, small area displays, LED lamps, etc. However, the drawbacks of inorganic materials include difficulties to process and to obtain large surface areas and efficient blue light.

Organic materials, which includes both small molecules and polymeric materials, offer several advantages over inorganic materials for LEDs, such as simpler manufacturing, low operating voltages, the possibility of producing large area and full-color displays. Conjugated polymers such as poly(phenylvinylene) (PPV) were first introduced as EL materials by Burroughes et al in 1990 (Burroughes, J. H. et al, *Nature* 1990, 347, 539-41). Tremendous progress has been made since then to improve the stability, efficiency, and durability of polymeric LEDs (Bernius, M. T. et al, *Adv. Mater.* 2000, 12, 1737). Organic LED (OLED) represents an alternative to the well-established display technologies based on cathode-ray tubes and liquid crystal displays (LCDs), especially for large area displays. OLED has been demonstrated to be brighter, thinner, lighter, and faster than LCDs. Moreover it requires less power to operate, offers higher contrast and wide viewing angle (>165 degree), and has great potential to be cheaper to manufacture, especially the polymer-based LEDs (PLED).

The OLED technology has stimulated intensive research activities across all disciplines. Currently, great efforts in materials research have been focused on efficient novel materials for full-color flexible displays. Full-color displays require three basic colors, red, green and blue, and flexible substrates require low temperature and easy processing of the organic materials. PLED devices show great promise in meeting both requirements, since the emission color can be tailored by modulation of the chemical structures and the solution processing allows for micro-patterning of the fine multicolor pixels via inkjet printing technique. However, processable, stable, and efficient blue light emitting organic materials are still highly desirable to meet the challenge. Blue light requires a wide energy band. With blue light emitting polymers as primary materials, it is possible to produce other colors by a downhill energy transfer process. For instance, a green or red EL emission can be obtained by doping a blue EL host material with a small amount of green or red luminescent material.

Furthermore, efficient EL devices require balanced charge injection and transport. The turn-on voltage depends on the energy barriers for charge injection. The mobility of the injected charges in organic polymers is low compared to that in inorganic semiconductors, which might increase the recombination time for the electrons and holes in the polymer. Moreover, most EL polymers transport preferentially either electrons or holes that leads to the recombination zone close to the electrodes and quenching of excitons. This is one of the main sources of reduced efficiency. Many research efforts have been focused on the design of polymers with improved charge injection and transporting.

It is known that imine nitrogens (C=N) are electron-deficient and are capable of transporting electrons. Oxadiazoles, pyridines, quinolines, quinoxazolines, triazines, and bithiozoles all process electron transporting properties. Electron transporting small organic molecules such as 2-(4-biphenylyl)-5-(4-tert-butylphenyl)-1,3,4-oxadiazole (PBD) have been dispersed in inert polymers or blended with EL polymers to improve electron transporting capability (Zhang, C. et al. *Synth. Met.* 1995, 72, 185; Berggren, M. et al. *Adv. Mater.* 1995, 7, 900). However, the incompatibility in general leads to phase separation or recrystallization especially at higher temperature during device operation. Oxadiazoles containing polymers have been intensively investigated. A number of polymers containing oxadiazole moiety have been reported by several research groups (Yang, Y. et al. *Chem. Mater.* 1995, 7, 1568). However, most of these polymers do not meet the requirement of low driving voltage or improved efficiency.

SUMMARY OF THE INVENTION

It is an object of the present invention to provide novel highly efficient luminescent materials useful in emissive layers.

It is another object of the present invention to provide wide energy band gap luminescent materials.

It is another object of the present invention to provide novel charge transport materials useful in electroluminescent devices.

These objects are achieved in an electroluminescent device, comprising:

a) a spaced-apart anode and cathode; and b) an organic layer disposed between the spaced-apart anode and cathode and including a polymer having an azole structure represented by formula (I)

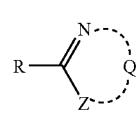

wherein:
  Z is O, NR', or S;
  Q represents atoms necessary to complete a hetero ring with N and Z;
  R is a substituent and selected from hydrogen, or alkyl, or alkenyl, or alkynyl, or alkoxy wherein the alkyl, alkenyl, alkynyl or alkoxy can have from 1 to 40 carbon atoms; or aryl from 6 to 60 carbon atoms; or heteroaryl from 4 to 60 carbons; or F, or Cl, or Br; or a cyano group; or a nitro group; or atoms coupled to N or Z to complete a fused aromatic or heteroaromatic ring; and
  R' is hydrogen, or alkyl, or alkenyl, or alkynyl of from 1 to 40 carbon atoms wherein the alkyl, alkenyl, alkynyl or alkoxy can have from 1 to 40 carbon atoms; aryl from 6 to 60 carbon atoms; or heteroaryl from 4 to 60 carbons; or F, or Cl, or Br.

The present invention provides organic luminescent materials with a number of advantages that include excellent solubility and thermal stability, high efficiency, and good charge transport capability.

The present invention includes a polymer having a particular azole structure that itself is emissive and can be used in an emissive layer of an electroluminescent device, and it also can be used as a host, particularly for phosphorescent dopants. This azole structure also is useful in an electron transport layer.

DETAILED DESCRIPTION OF THE INVENTION

Figure 1:
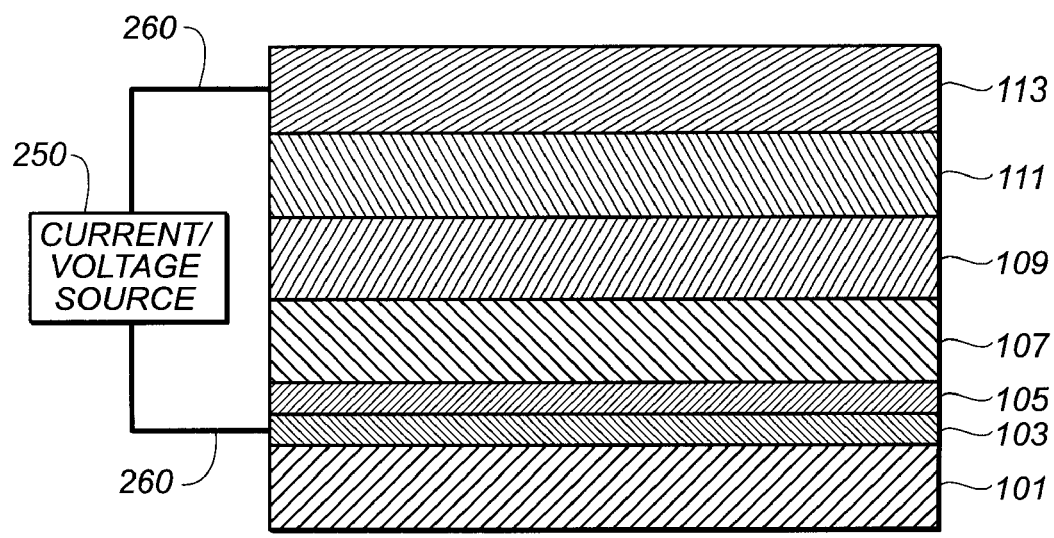
FIG. 1 illustrates in cross-section a basic structure of an EL device.

It has been discovered that small molecule azole compounds are useful as emitting layer or electron transport layer in efficient EL devices as disclosed in commonly-assigned U.S. Pat. Nos. 5,645,948 and 5,766,779. The present invention provides highly efficient organic light-emitting materials that include a conjugated polymer having an azole structure with good electron transport capability, excellent solubility, thermal stability, and improved efficiency. A conjugated polymer is one that possesses a delocalized pi-electron system along the backbone. The azole structure is represented by formula (I), wherein:

Z is O, NR', or S;

Q represents atoms necessary to complete a hetero ring with N and Z and, if possible, R and Z, or R and Q may be bound to each other to form a ring;

R is a substituent and selected from hydrogen, or alkyl, or alkenyl, or alkynyl, or alkoxy of from 1 to 40 carbon atoms; aryl or substituted aryl of from 6 to 60 carbon atoms; or heteroaryl or substituted heteroaryl of from 4 to 60 carbons; or F, or Cl, or Br; or a cyano group; or a nitro group; or atoms necessary to complete a fused aromatic or heteroaromatic ring; and R' is hydrogen, or alkyl, or alkenyl, or alkynyl of from 1 to 40 carbon atoms; aryl or substituted aryl of from 6 to 60 carbon atoms; or heteroaryl or substituted heteroaryl of from 4 to 60 carbons; or F, or Cl, or Br; or atoms necessary to complete a fused aromatic or heteroaromatic ring.

For example, R and R' are independently hygrogen, methyl, ethyl, propyl, isopropyl, butyl, isobutyl, t-butyl, pentyl, hexyl, ethylhexyl, heptyl, octyl, nonyl, decyl, dodecyl, hexadecyl, cyclohexyl, cyclopentyl, methoxy, ethoxy, butoxy, hexyloxy, ethylhexyloxy, methoxyethoxyethyl, methoxyethyloxyethoxyethyl, phenyl, tolyl, nathphyl, xylene, anthracene, phenanthrene, phenylmethylenephenyl, benzyl, phenoxy, pyridyl, thiophenyl, furyl, or quinolinyl. R and R' are groups that form fused aromatic or heteroaromatic rings such as naphthalene, anthracene, perylene, phenanthrene, pyrene, tetracene, pentacene, triphenylene, and benzo[a]pyrene. Preferably, R and R' are hydrogen, t-butyl, hexyl, 2-ethylhexyl, octyl, 3,7-dimethyloctyl, decyl, heptyl, phenyl, 2-ethylhexyloxy, or 4-methoxypheny; diphenylamino, (4-diphenylamino)phenyl; R and R' are groups that forms fused aromatic rings such as naphthalene, anthracene, perylene, pyrene, phenanthrene, or tetracene.

In some embodiments Q represents atoms necessary to complete a five-member hetero ring with N and Z, the azole of structure formula (I) is represented by formula (Ia), wherein:

$Z_1$ and $Z_2$ are the same or different, and are selected from CR', O, NR', or S, and R' is defined above.

In preferred embodiments, when $Z_1$ and $Z_2$ are atoms necessary to complete a fused five- or six-member aromatic or heteroaromatic ring, the azole of structure formula (I) is represented by formula (Ib1) and (Ib2), wherein:

$Z_1$, $Z_2$, $Z_3$, $Z_4$, $Z_5$, and $Z_6$ are the same or different, and $Z_3$, $Z_4$, $Z_5$, and $Z_6$ are defined as the same as $Z_1$, and $Z_2$ noted above.

In more preferred embodiments, when $Z_1$ and $Z_2$ are CR' or NR' to complete a fused six-member aromatic or heteroaromatic ring, the azole of structure formula (I) is represented by formula (Ic), (Id), and (Ie), wherein:

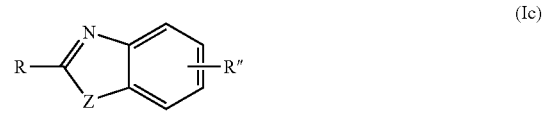

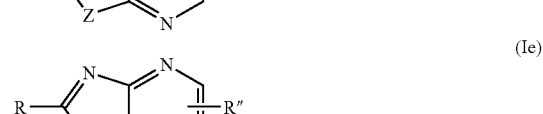

R" is defined as the same as R noted above.

Conjugated polymers including the azole structure are represented by repeating units of formula (II) that includes the azole structure as part of the polymer main chain and repeating units of formula (III) which includes the azole structure as part of the polymer side chain.

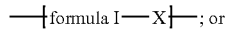 (II)

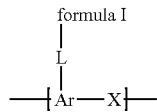 (III)

wherein:
- X is a conjugated group of 2 to 60 carbon atoms;
- Ar is an aryl or substituted aryl group containing 6 to 60 carbon atoms; or heteroaryl or substituted heteroaryl containing 4 to 60 carbon atoms, and at least one or more N, S, or O atoms; and
- L is a direct bond between formula (I) and Ar or a carbon linking group having 1 to 40 carbon atoms or a non-carbon linking group having 0 to 40 carbon atoms that includes an alkyl, alkenyl, alkynyl, aryl, or heteroaryl; L may also contains O, N, S, F, Cl, or Br, or Si atoms;

Incorporating X into the polymers comprising the azole structure represented by formula (II), and (III) can further improves solubility, or electron or hole transporting mobility, or finely tune the emission color.

The present invention includes a conjugated polymer having a particular azole structure that itself is emissive and can be used in an emissive layer of an electroluminescent device. This azole structure also is useful in an electron transport layer.

X is a conjugated group of 2-60 carbon atoms that includes vinylenes, ethynylenes, arylenes, heteroarylenes, arylene vinylenes, heteroarylene vinylenes, and combinations thereof;

For example, arylenes contain 6 to 60 carbon atoms which include phenyl, biphenyl, naphthyl, anthracene, fluorene, phenanthrene, spirophenyl, spirofluorene, perylene, or pyrene groups;

Heteroarylenes contain 4 to 60 carbon atoms which include pyridine, thiophene, pyrrole, bithiophene, furan, benzofuran, benzimidazole, benzoxazole, quinoxaline, phenylquinoline, diphenyloxadizaole, or carbazole;

Vinylenes, ethynylenes, arylenes, heteroarylenes, arylene vinylenes, and heteroarylene vinylenes may be substituted or unsubstituted. The substituents include but are not limited to alkyl or alkoxy groups containing 1 to 40 carbon atoms, aryl groups containing 6 to 60 carbon atoms; or heteroaryl groups containing 4 to 60 carbons; or F, Cl, or Br; or a cyano group; or a nitro group.

X can be divided into the following groups.

Group I:
X is a vinylene, or ethynylene group of formula (IV):

—W— (IV)

wherein:
W contains 2 to 40 carbon atoms, may also contains O, N, S, F, Cl, or Br, or Si atoms.

The following structures constitute specific examples of formula (IV)

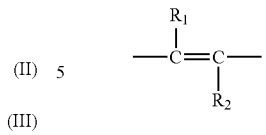

wherein: $R_1$ and $R_2$ are individually hydrogen, or alkyl of 1 to 40 carbon atoms, or aryl containing 6 to 60 carbon atoms; or heteroaryl containing 4 to 60 carbons; or F, Cl, or Br; or a cyano group; or a nitro group; or

—C≡C—

Group II:
X is a group containing two aryl or heteroaryl groups connected by a linking group $L_1$ of formula (V):

—(Ar$_1$)—L$_1$—(Ar$_2$)— (V)

wherein:
Ar$_1$ and Ar$_2$ are aryl groups containing 6 to 60 carbon atoms, or heteroaryl groups containing 4 to 60 carbon atoms, and at least one or more N, S, or O atoms; and
$L_1$ is a linking groups containing 0 to 40 carbon atoms, may contain N, Si, O, Cl, F, Br, or S atoms.

The following structures constitute specific examples of formula (V)

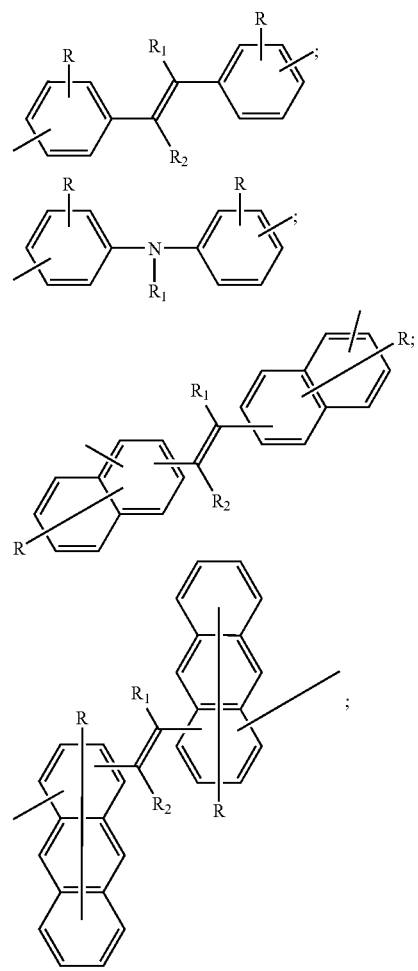

-continued

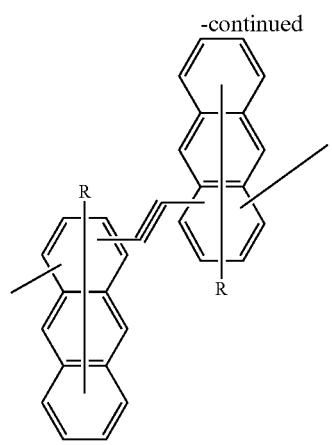

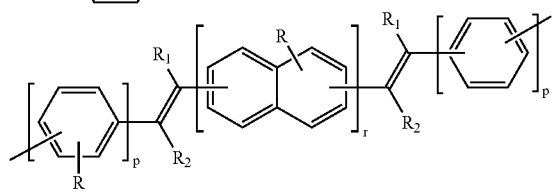

wherein: p and r are integers from 1 to 4;

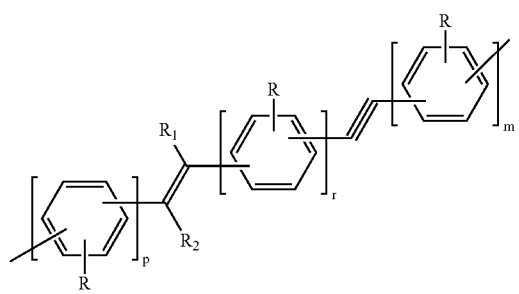

wherein: m is an integer from 1 to 4;

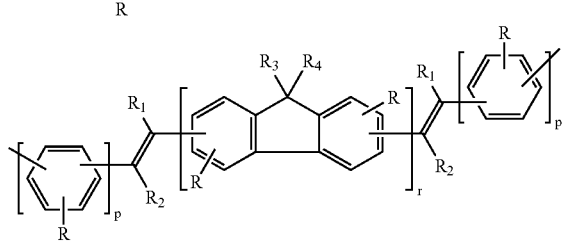

wherein: $R_3$ and $R_4$ are substituents each being individually hydrogen, or alkyl, or alkenyl, or alkynyl, or alkoxy of from 1 to 40 carbon atoms; aryl or substituted aryl of from 6 to 60 carbon atoms; or heteroaryl or substituted heteroaryl of from 4 to 60 carbons; or F, Cl, or Br; or a cyano group; or a nitro group;

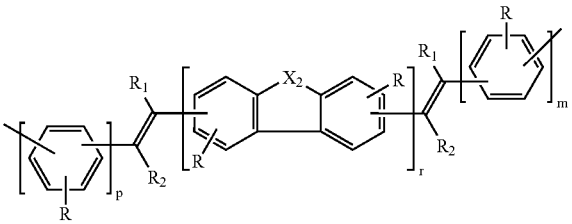

wherein: $X_2$ is S, Se, or O atom, $SiR_2$, or N—R; or

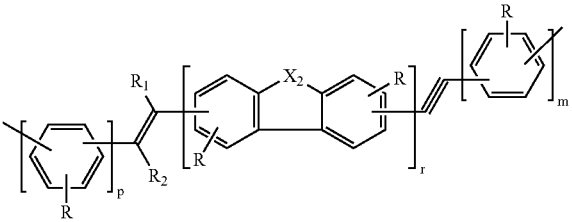

Group III:

X is an aryl or heteroaryl group of formula (VI):

$$—Ar_3—$$ (VI)

wherein:

$Ar_3$ is an aryl or substituted aryl group containing 6 to 60 carbon atoms; or heteroaryl or substituted heteroaryl containing 4 to 60 carbon atoms, and at least one or more N, S, or O atoms;

The following structures constitute specific examples of formula (VI)

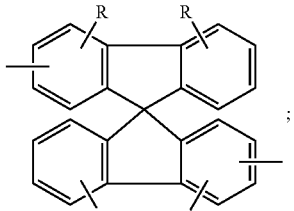

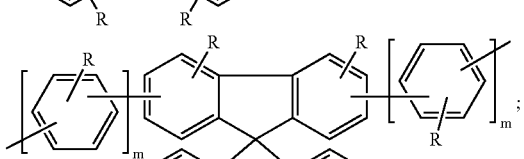

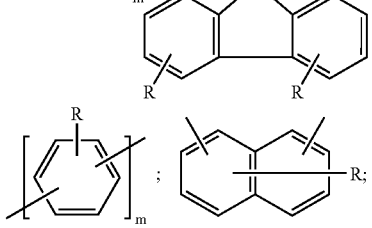

-continued
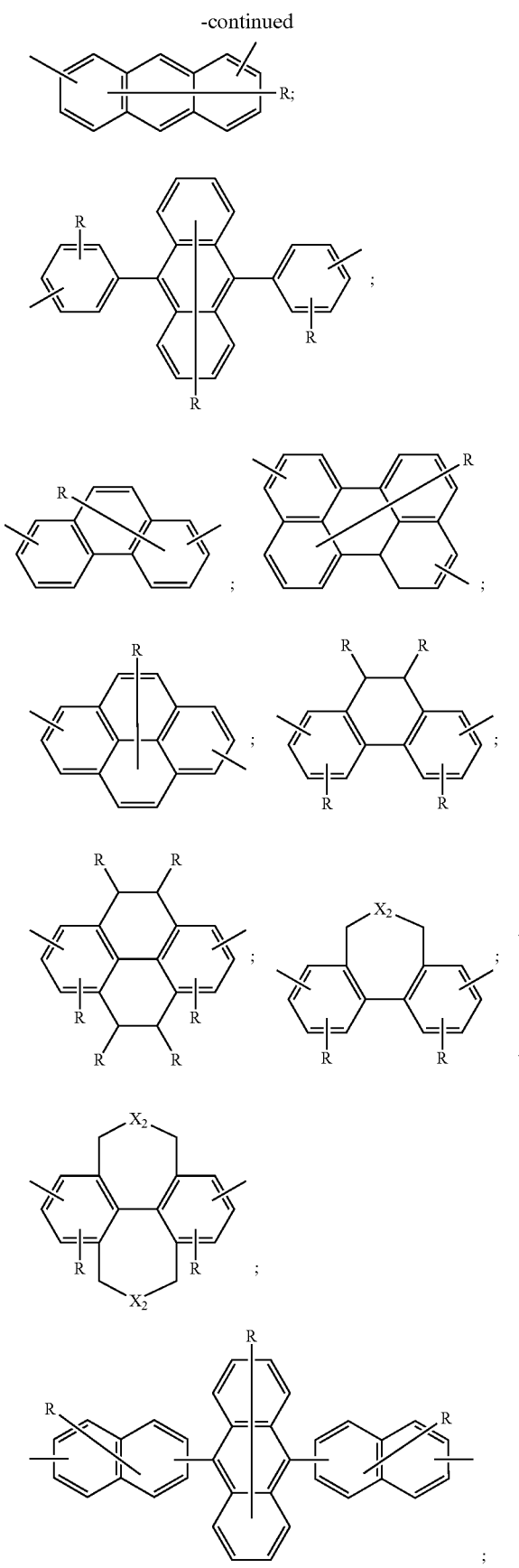
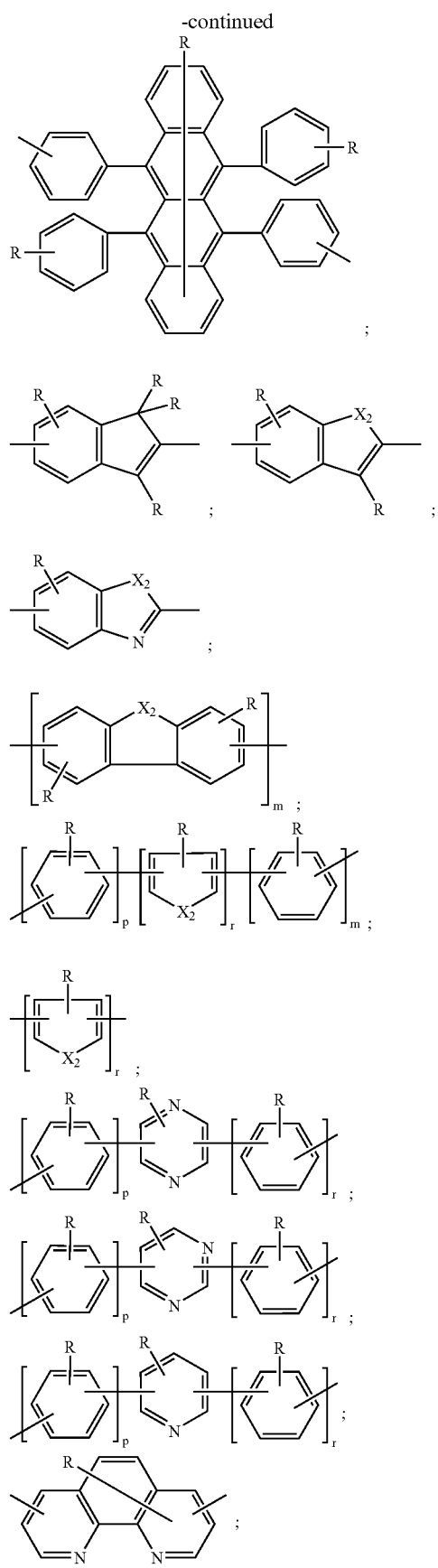

-continued

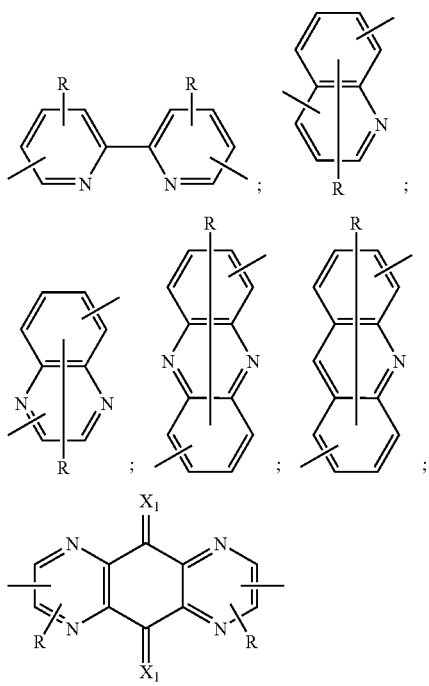

wherein: $X_1$ is an O atom or two cyano groups;

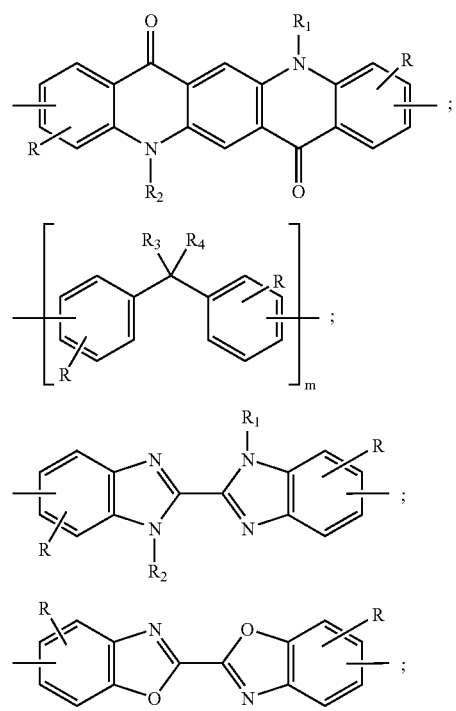

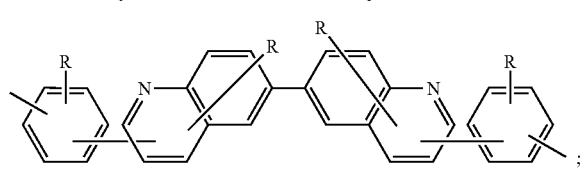

-continued

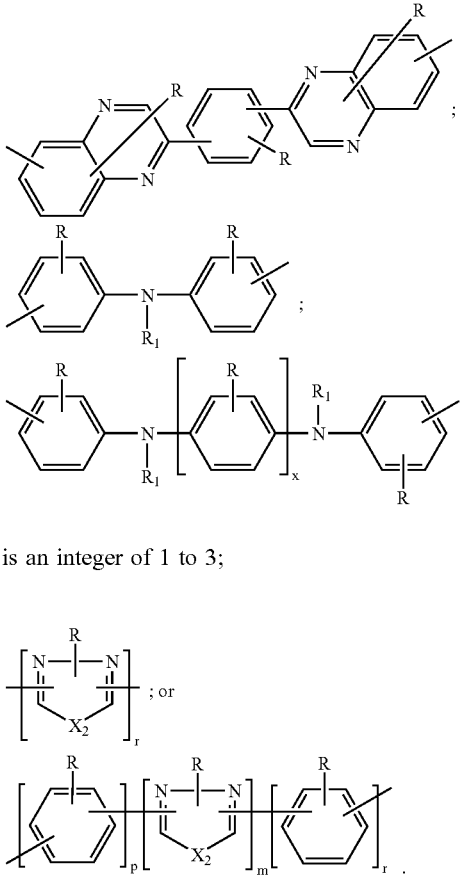

x is an integer of 1 to 3;

X can be one or the combination of more than one of the above groups.

L is a direct bond between formula (I) and Ar or a carbon linking group having 1 to 40 carbon atoms or a non-carbon linking group having 0 to 40 carbon atoms. When L is a linking group, it includes but are not limited to the following groups:

Group I:
 L is an ether, or thioether linking group:

—O—; or

—S—

Group II:
 L is an ester linking group:

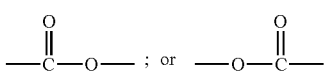

Group III:
 L is an anhydride linking group:

Group IV:
L is a carbonate linking group:

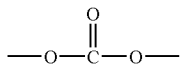

Group V:
L is a sulfone or sulfine linking group:

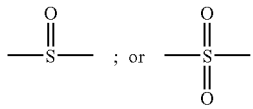

Group VI:
L is an amino or silo linking group:

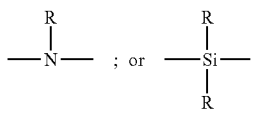

Group VII:
L is an amide linking group:

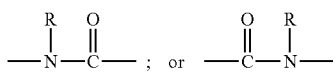

Group VIII:
L is a urea linking group:

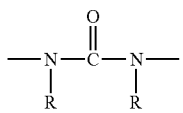

Group IX:
L is an alkyl, alkenyl, or alkynyl group:

wherein:
Y contains 1 to 40 carbon atoms, may also contains O, N, S, F, Cl, Br, or Si atoms.
L is an aryl or heteroaryl linking group:

L can be one or the combination of more than one of the above groups.

The following molecular structures constitute specific examples of preferred polymers satisfying the requirement of this invention:

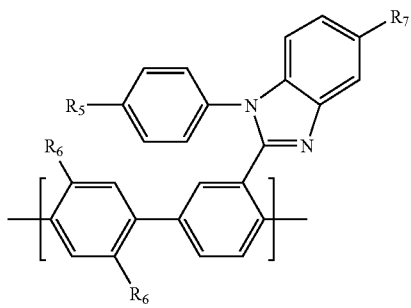

polymer 1 $R_5=R_6$=n-hexyl, $R_7$=2-ethylhexyl polymer 2 $R_5$=H, $R_6=R_7$=3,7-dimethyloctyl polymer 3 $R_5$=4-(bis(4-methylphenyl)amino)phenyl, $R_6$=H, $R_7$=t-butyl polymer 4 $R_5$=4-(N-carbazole)phenyl, $R_6$=n-decyl, $R_7$=H polymer 5 $R_5$=n-hexyl, $R_6=R_7$=H polymer 6 $R_5=R_6$=n-hexyloxy, $R_7$=H polymer 7 $R_5=R_6=R_7$=n-hexyloxy

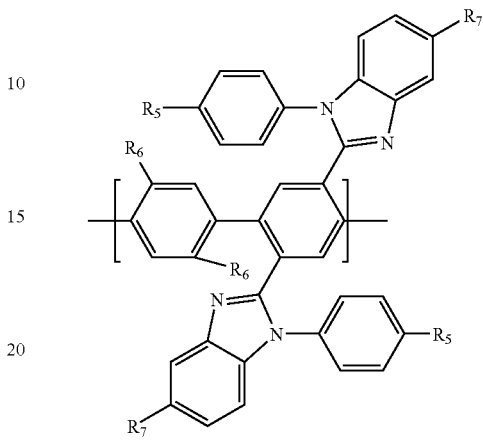

polymer 8 $R_5=R_6$=n-hexyl, $R_7$=2-ethylhexyl polymer 9 $R_5$=H, $R_6=R_7$=3,7-dimethyloctyl polymer 10 $R_5$=4-(bis(4-methylphenyl)amino)phenyl, $R_6$=H, $R_7$=t-butyl polymer 11 $R_5$=4-(N-carbazole)phenyl, $R_6$=n-decyl, $R_7$=H polymer 12 $R_5$=n-hexyl, $R_6=R_7$=H polymer 13 $R_5=R_6$=n-hexyloxy, $R_7$=H polymer 14 $R_5=R_6=R_7$=n-hexyloxy

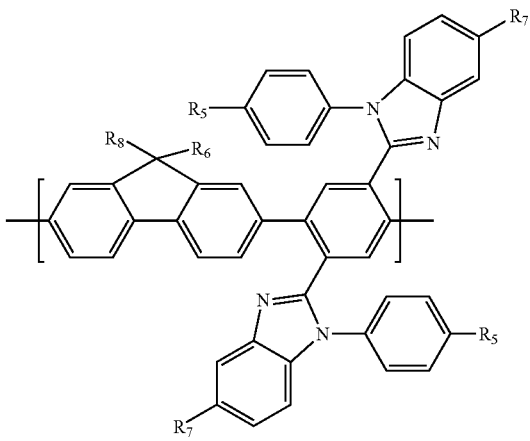

polymer 15 $R_5=R_6=R_7=R_8$=n-hexyl polymer 16 $R_5=R_7$=H, $R_6=R_8$=3,7-dimethyloctyl polymer 17 $R_5=R_7$=H, $R_6$=4-(bis(4-methylphenyl)amino)phenyl, $R_8$ n-hexyl polymer 18 $R_5$=4-(N-carbazole)phenyl, $R_6=R_8$=n-decyl, $R_7$=H polymer 19 $R_5$=n-hexyloxy, $R_6=R_7$=n-hexyl, $R_8$=n-octyl

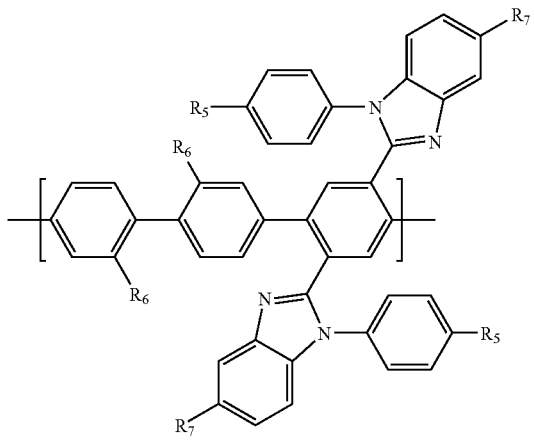

polymer 20 R₅=R₆=n-hexyl, R₇=2-ethylhexyl polymer 21 R₅=H, R₆=R₇=3,7-dimethyloctyl polymer 22 R₅=4-(bis(4-methylphenyl)amino)phenyl, R₆=H, R₇=t-butyl polymer 23 R₅=4-(N-carbazole)phenyl, R₆=n-decyl, R₇=H polymer 24 R₅=n-hexyl, R₆=R₇=H

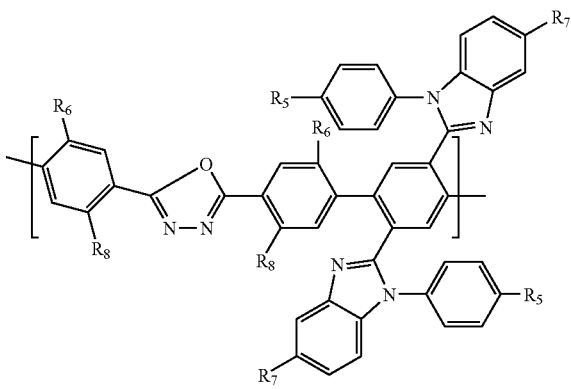

polymer 25 R₅=R₆=R₇=R₈=n-hexyl polymer 26 R₅=n-hexyl, R₇=H, R₆=R₈=3,7-dimethyloctyloxy polymer 27 R₅=R₇=H, R₆=4-(bis(4-methylphenyl)amino)phenyl, R₈=H polymer 28 R₅=4-(N-carbazole)phenyl, R₆=n-decyl, R₇=R₈=H

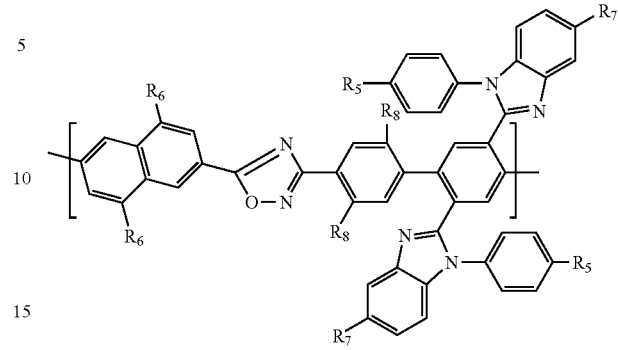

polymer 29 R₅=R₆=R₇=R₈=n-hexyl polymer 30 R₅=n-hexyl, R₇=H, R₆=R₈=3,7-dimethyloctyloxy polymer 31 R₅=R₇=H, R₆=4-(bis(4-methylphenyl)amino)phenyl, R₈=H polymer 32 R₅=n-hexyloxy, R₆=n-decyl, R₇=R₈=H

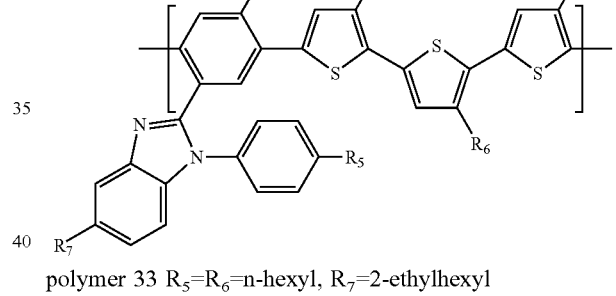

polymer 33 R₅=R₆=n-hexyl, R₇=2-ethylhexyl polymer 34 R₅=H, R₆=R₇=3,7-dimethyloctyl polymer 35 R₅=4-(bis(4-methylphenyl)amino)phenyl, R₆=2-ethylhexyl, R₇=H polymer 36 R₅=R₆=n-hexyl, R₇=H polymer 37 R₅=R₇=n-hexyloxy, R₆=2-ethylhexyl

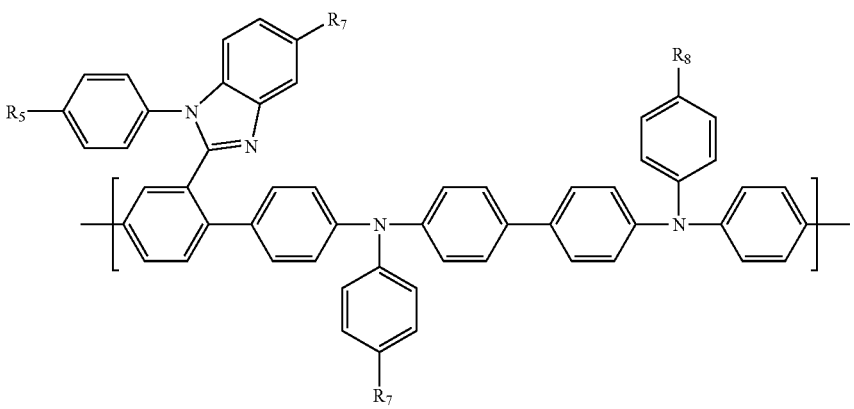

polymer 38 R$_5$=R$_6$=n-hexyl, R$_7$=R$_8$=2-ethylhexyl polymer 39 R$_5$=n-hexyl, R$_6$=H, R$_7$=R$_8$=t-butyl polymer 40 R$_5$=R$_7$=R$_8$=4-(bis(4-methylphenyl)amino)phenyl, R$_6$=H polymer 41 R$_5$=R$_6$=n-hexyl, R$_7$=R$_8$=(4-carbazole)phenyl polymer 42 R$_5$=n-hexyloxy, R$_6$=H, R$_7$=2-ethylhexyl, R$_8$=diphenylamino

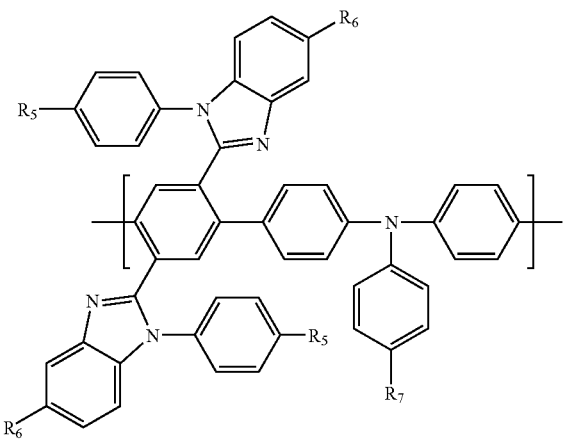

polymer 43 R$_5$=n-hexyl, R$_6$=H, R$_7$=t-butyl polymer 44 R$_5$=R$_7$=4-(bis(4-methylphenyl)amino)phenyl, R$_6$=H polymer 45 R$_5$=R$_6$=n-hexyl, R$_7$=(4-carbazole)phenyl polymer 46 R$_5$=n-hexyloxy, R$_6$=H, R$_7$=diphenylamino polymer 47 R$_5$=R$_6$=n-hexyl, R$_7$=trifluoromethyl

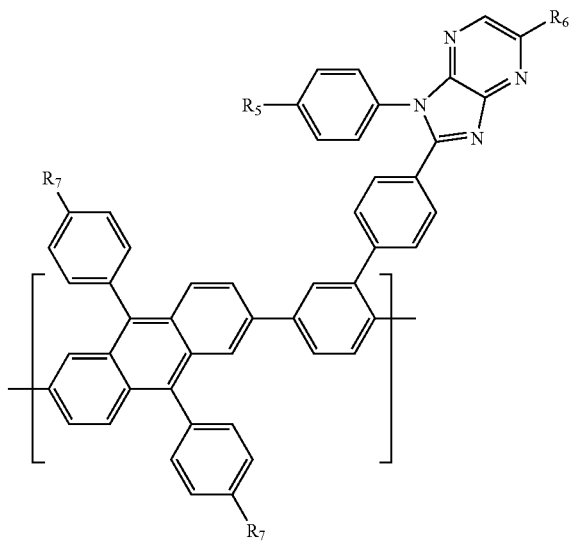

polymer 48 R$_5$=n-hexyl, R$_6$=H, R$_7$=t-butyl polymer 49 R$_5$=R$_7$=4-(bis(4-methylphenyl)amino)phenyl, R$_6$=H polymer 50 R$_5$=R$_6$=n-hexyl, R$_7$=(4-carbazole)phenyl polymer 51 R$_5$=R$_7$=n-hexyloxy, R$_6$=diphenylamino polymer 52 R$_5$=H, R$_6$=n-hexyl, R$_7$ trifluoromethyl

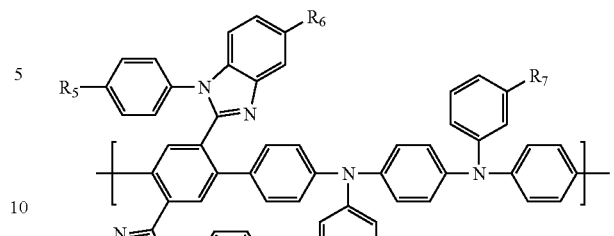

polymer 53 R$_5$=n-hexyl, R$_6$=H, R$_7$=t-butyl polymer 54 R$_5$=n-hexyl, R$_6$=H, R$_7$=methoxycarbonyl polymer 55 R$_5$=4-(bis(4-methylphenyl)amino)phenyl, R$_6$=R$_7$=H polymer 56 R$_5$=R$_6$=n-hexyl, R$_7$=(4-carbazole)phenyl polymer 57 R$_5$=n-hexyloxy, R$_6$=H, R$_7$=diphenylamino polymer 58 R$_5$=R$_6$=n-hexyl, R$_7$=trifluoromethyl

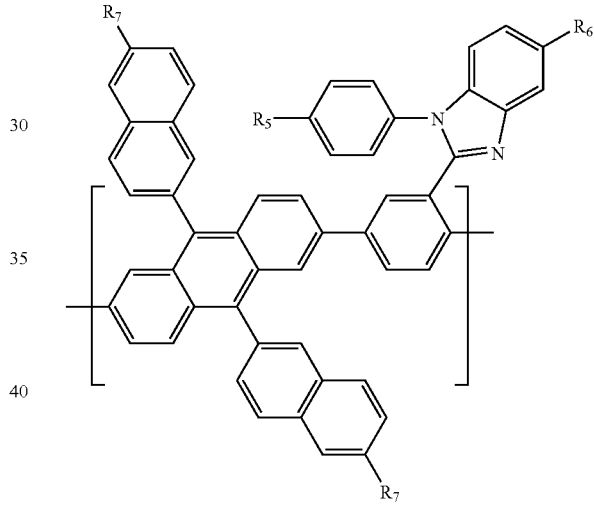

polymer 59 R$_5$=R$_6$=R$_7$=n-hexyl polymer 60 R$_5$=n-hexyl, R$_6$=H, R$_7$=2-ethylhexyloxy polymer 61 R$_5$=4-(bis(4-methylphenyl)amino)phenyl, R$_6$=n-hexyl, R$_7$=t-butyl polymer 62 R$_5$=R$_6$=n-hexyl, R$_7$=(4-carbazole)phenyl polymer 63 R$_5$=R$_7$=n-hexyloxy, R$_6$=diphenylamino

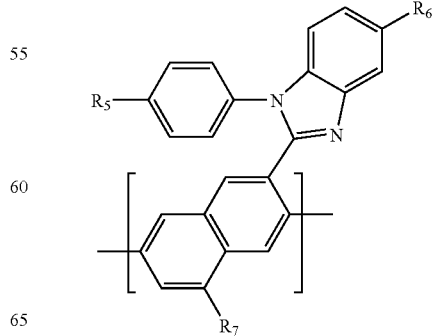

polymer 64 $R_5=R_6=R_7$=n-hexyl polymer 65 $R_5$=n-hexyl, $R_6$=H, $R_7$=2-ethylhexyloxy polymer 66 $R_5$=4-(bis(4-methylphenyl)amino)phenyl, $R_6$=n-hexyl, $R_7$=H polymer 67 $R_5=R_6$=n-hexyl, $R_7$=(4-carbazole)phenyl polymer 68 $R_5=R_7$=n-hexyloxy, $R_6$=diphenylamino

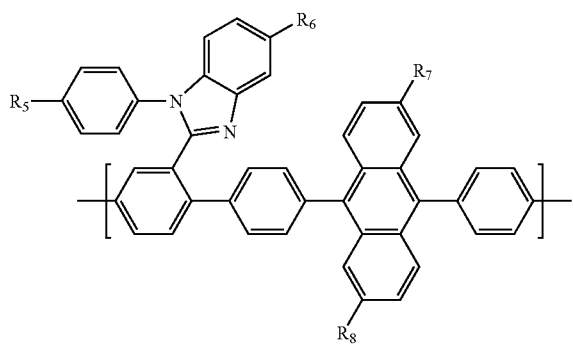

polymer 69 $R_5=R_6$=n-hexyl, $R_7=R_8$=2-ethylhexyloxy polymer 70 $R_5$=n-hexyl, $R_6$=H, $R_7=R_8$=t-butyl polymer 71 $R_5=R_7=R_8$=4-(bis(4-methylphenyl)amino)phenyl, $R_6$=H polymer 72 $R_5$=n-hexyloxy, $R_6$=H, $R_{7=2}$-ethylhexyl, $R_8$=diphenylamino polymer 73 $R_5=R_6$=n-hexyl, $R_7=R_8$=3,7-dimethyloctyl

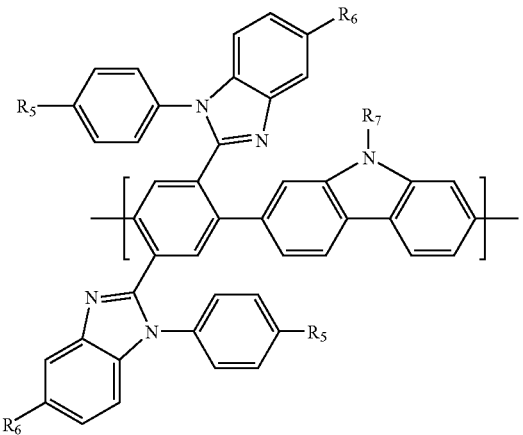

polymer 74 $R_5$=n-hexyl, $R_6$=H, $R_7$=(4-t-butyl)phenyl polymer 75 $R_5$=n-hexyl, $R_6$=H, $R_7$=2-ethylhexyl polymer 76 $R_5=R_7$=4-(bis(4-methylphenyl)amino)phenyl, $R_6$=H polymer 77 $R_5=R_6$=n-hexyl, $R_7$=2-ethylhexyl polymer 78 $R_5$=n-hexyloxy, $R_6$=H, $R_7$=t-butyl polymer 79 $R_5=R_6$=n-hexyl, $R_7$=trifluoromethyl

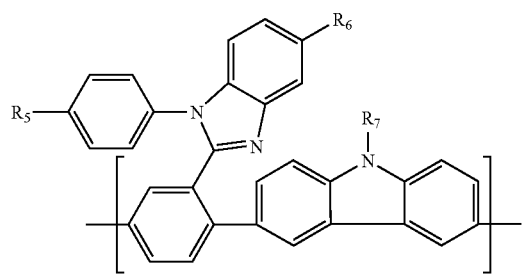

polymer 80 $R_5$=n-hexyl, $R_6$=H, $R_7$=(4-t-butyl)phenyl polymer 81 $R_5=R_7$=4-(bis(4-methylphenyl)amino)phenyl, $R_6$=H polymer 82 $R_5=R_6$=n-hexyl, $R_7$=2-ethylhexyl polymer 83 $R_5$=n-hexyloxy, $R_6$=H, $R_7$=t-butyl

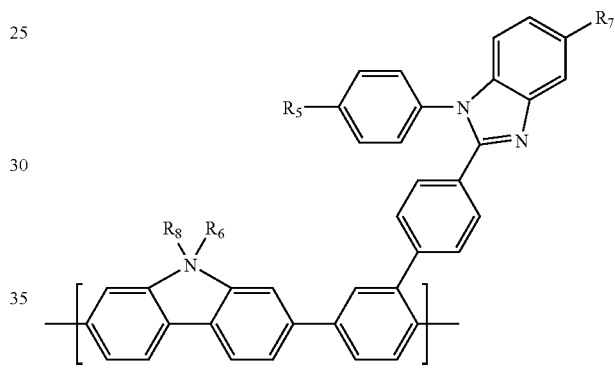

polymer 84 $R_5=R_6=R_7=R_8$=n-hexyl polymer 85 $R_5=R_7$=H, $R_6=R_8$=3,7-dimethyloctyl polymer 86 $R_5=R_7$=H, $R_6$=4-(bis(4-methylphenyl)amino)phenyl, $R_8$=n-hexyl polymer 87 $R_5$=4-(N-carbazole)phenyl, $R_6=R_8$=n-decyl, $R_7$=H polymer 88 $R_5$=n-hexyloxy, $R_6=R_7$=n-hexyl, $R_8$=n-octyl

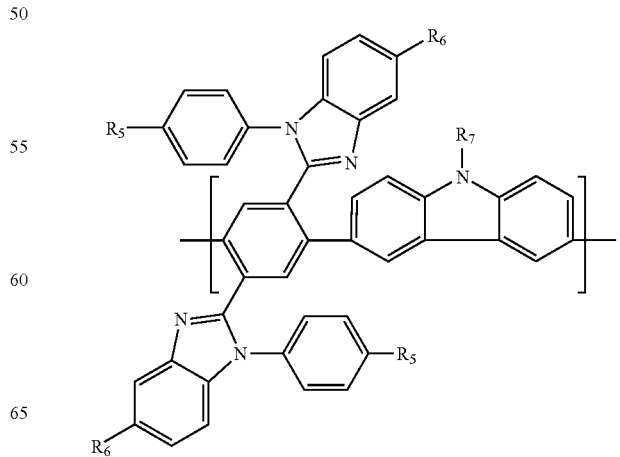

polymer 89 $R_5$=n-hexyl, $R_6$=H, $R_7$=(4-t-butyl)phenyl polymer 90 $R_5$=n-hexyl, $R_6$=H, $R_7$=2-ethylhexyl polymer 91 $R_5$=$R_7$=4-(bis(4-methylphenyl)amino)phenyl, $R_6$=H polymer 92 $R_5$=$R_6$=n-hexyl, $R_7$=2-ethylhexyl

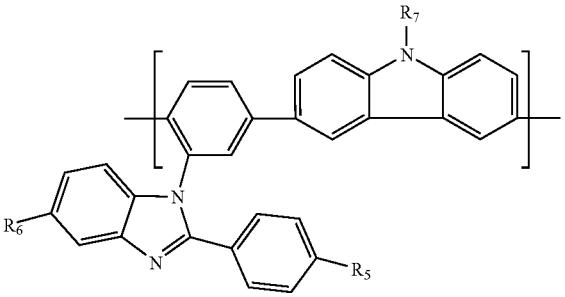

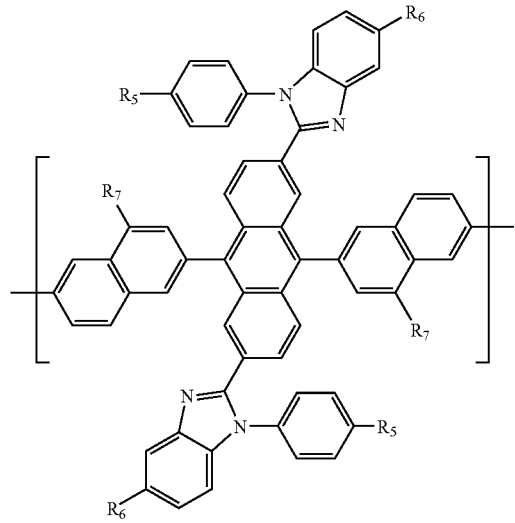

polymer 93 $R_5$=n-hexyl, $R_6$=H, $R_7$=(4-t-butyl)phenyl polymer 94 $R_5$=$R_7$=4-(bis(4-methylphenyl)amino)phenyl, $R_6$=H polymer 95 $R_5$=$R_6$=n-hexyl, $R_7$=2-ethylhexyl polymer 96 $R_5$=$R_6$=$R_7$=n-hexyloxy polymer 101 $R_5$=n-hexyl, $R_6$=H, $R_7$=(4-t-butyl)phenyl polymer 102 $R_5$=n-hexyl, $R_6$=H, $R_7$=2-ethylhexyl polymer 103 $R_5$=$R_7$=4-(bis(4-methylphenyl)amino)phenyl, $R_6$=H

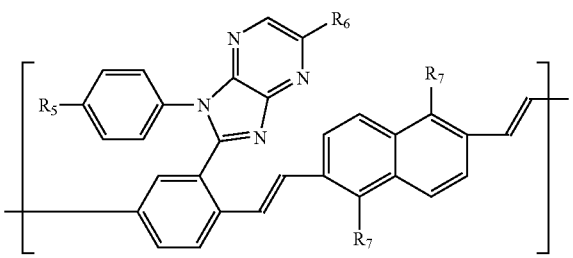

polymer 104 $R_5$=$R_6$=$R_7$=n-hexyl polymer 105 $R_5$=$R_7$=4-(bis(4-methylphenyl)amino)phenyl, $R_6$=H polymer 106 $R_5$=H, $R_6$=n-hexyl, $R_7$=2-ethylhexyl polymer 107 $R_5$=$R_6$=$R_7$=n-hexyloxy

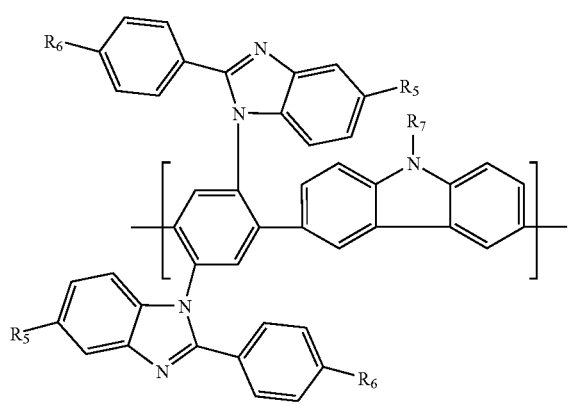

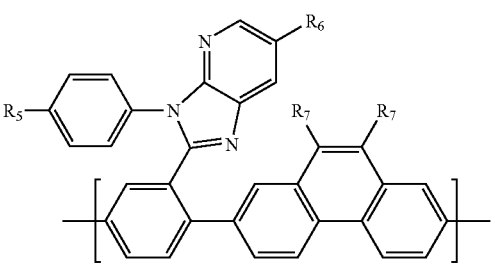

polymer 97 $R_5$=n-hexyl, $R_6$=H, $R_7$=(4-t-butyl)phenyl polymer 98 $R_5$=H, $R_6$=n-hexyl, $R_7$=2-ethylhexyl polymer 99 $R_5$=H, $R_6$=$R_7$=4-(bis(4-methylphenyl)amino)phenyl polymer 100 $R_5$=$R_6$=n-hexyl, $R_7$=2-ethylhexyl polymer 108 $R_5$=$R_6$=3,7-dimethyloctyl, $R_7$=H polymer 109 $R_5$=$R_7$=4-(bis(4-methylphenyl)amino)phenyl, $R_6$=H polymer 110 $R_5$=$R_6$=n-hexyloxy, $R_7$=2-ethylhexyloxy polymer 111 $R_5$=n-hexyloxy, $R_6$=H, $R_7$=t-butyl

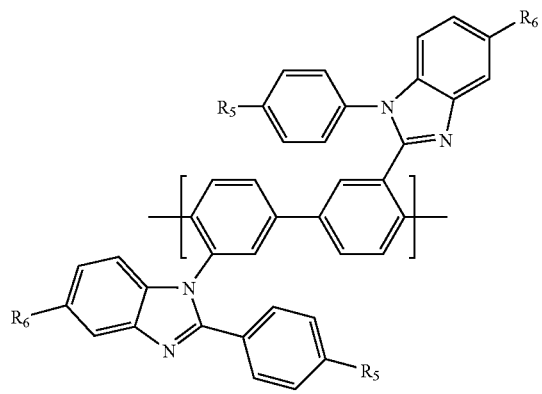

polymer 112 R$_5$=n-hexyl, R$_6$=H
polymer 113 R$_5$=n-hexyloxy, R$_6$=H
polymer 114 R$_5$=4-(bis(4-methylphenyl)amino)phenyl, R$_6$=n-hexyl
polymer 115 R$_5$=R$_6$=n-hexyl
polymer 116 R$_5$=H, R$_6$=n-hexyloxy
polymer 117 R$_5$=n-hexyl R$_6$=4-(t-butylphenyl)
polymer 118 R$_5$=R$_6$=4-(bis(4-methylphenyl)amino)phenyl

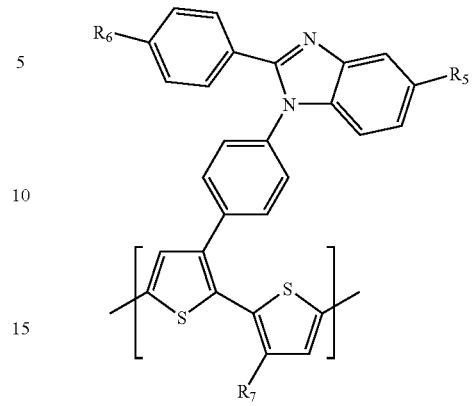

polymer 123 R$_5$=n-hexyl, R$_6$=R$_7$=H
polymer 124 R$_5$=R$_7$=4-(bis(4-methylphenyl)amino)phenyl, R$_6$=H
polymer 125 R$_5$=R$_6$=n-hexyl, R$_7$=2-ethylhexyl
polymer 126 R$_5$=n-hexyloxy, R$_6$=R$_7$=H

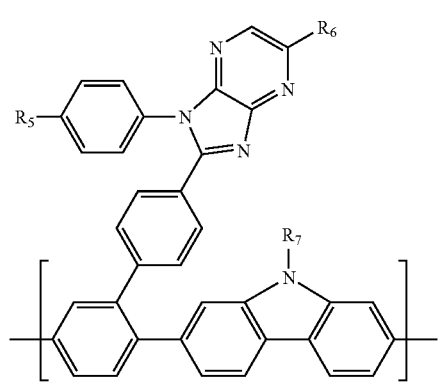

polymer 119 R$_5$=n-hexyl, R$_6$=H, R$_7$=(4-t-butyl)phenyl
polymer 120 R$_5$=n-hexyloxy, R$_6$=H, R$_7$=4-(t-butylphenyl)
polymer 121 R$_5$=R$_7$=4-(bis(4-methylphenyl)amino)phenyl, R$_6$=H
polymer 122 R$_5$=H, R$_6$=n-hexyl, R$_7$=3,7-dimethyloctyl

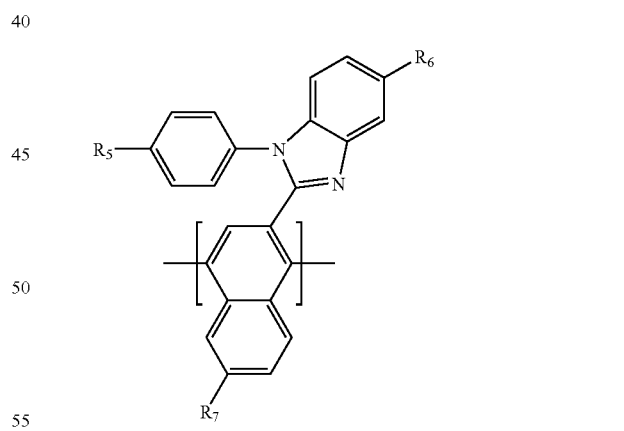

polymer 127 R$_5$=n-hexyl, R$_6$=H, R$_7$=(4-t-butyl)phenyl
polymer 128 R$_5$=R$_6$=R$_7$=n-hexyloxy
polymer 129 R$_5$=R$_7$=4-(bis(4-methylphenyl)amino)phenyl, R$_6$=H
polymer 130 R$_5$=H, R$_6$=n-hexyl, R$_7$=3,7-dimethyloctyl

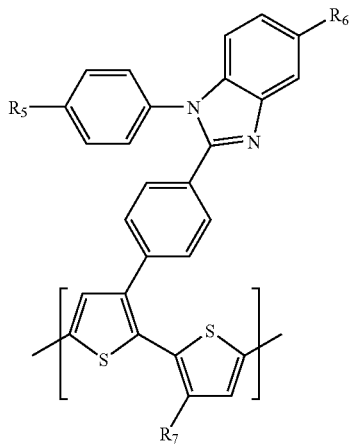

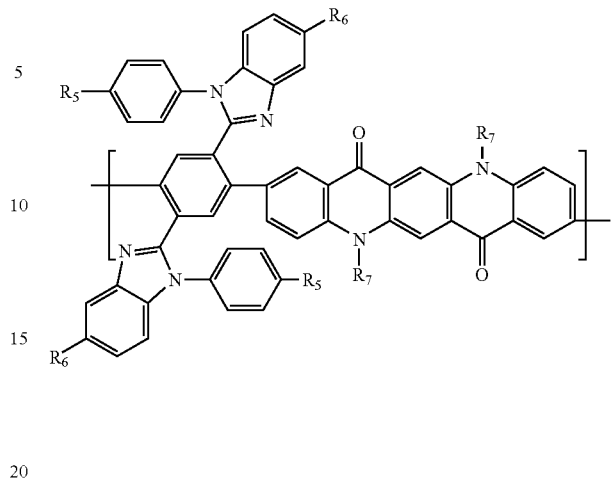

polymer 131 $R_5$=n-hexyl, $R_6$=$R_7$=H polymer 132 $R_5$=$R_7$=4-(bis(4-methylphenyl)amino)phenyl, $R_6$=H polymer 133 $R_5$=$R_6$=n-hexyl, $R_7$=2-ethylhexyl polymer 134 $R_5$=n-hexyloxy, $R_6$=$R_7$=H polymer 139 $R_5$=n-hexyl, $R_6$=H, $R_7$=(4-t-butyl)phenyl polymer 140 $R_5$=$R_7$=4-(bis(4-methylphenyl)amino)phenyl, $R_6$=H polymer 141 $R_5$=$R_6$=n-hexyl, $R_7$=2-ethylhexyl polymer 142 $R_5$=n-hexyloxy, $R_6$=H, $R_7$=t-butyl polymer 143 $R_5$=$R_6$=n-hexyl, $R_7$=trifluoromethyl

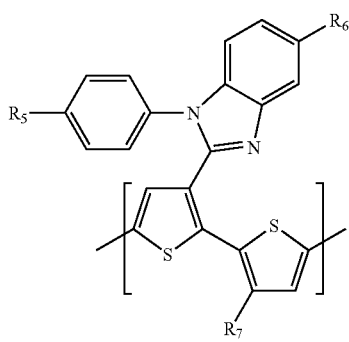

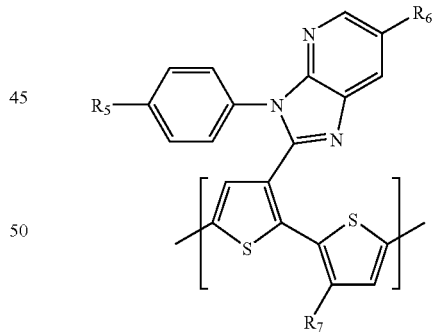

polymer 135 $R_5$=n-hexyl, $R_6$=$R_7$=H polymer 136 $R_5$=$R_7$=4-(bis(4-methylphenyl)amino)phenyl, $R_6$=H polymer 137 $R_5$=$R_6$=n-hexyl, $R_7$=2-ethylhexyl polymer 138 $R_5$=n-hexyloxy, $R_6$=$R_7$=H polymer 144 $R_5$=n-hexyl, $R_6$=H, $R_7$=(4-t-butyl)phenyl polymer 145 $R_5$=$R_7$=4-(bis(4-methylphenyl)amino)phenyl, $R_6$=H polymer 146 $R_5$=$R_6$=n-hexyl, $R_7$=2-ethylhexyl polymer 147 $R_5$=n-hexyloxy, $R_6$=$R_7$=2-ethylhexyl polymer 148 $R_5$=$R_6$=$R_7$=n-hexyl

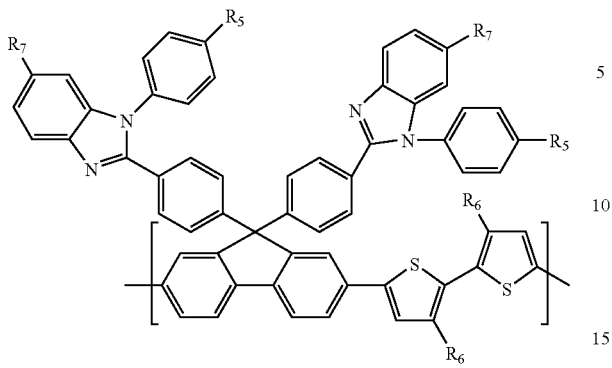

polymer 149 R$_5$=n-hexyl, R$_6$=H, R$_7$=(4-t-butyl)phenyl polymer 150 R$_5$=R$_7$=4-(bis(4-methylphenyl)amino)phenyl, R$_6$=H polymer 151 R$_5$=R$_6$=n-hexyl, R$_7$=2-ethylhexyl polymer 152 R$_5$=n-hexyloxy, R$_6$=2-ethylhexyl, R$_7$=t-butyl polymer 153 R$_5$=R$_6$=n-hexyl, R$_7$=trifluoromethyl

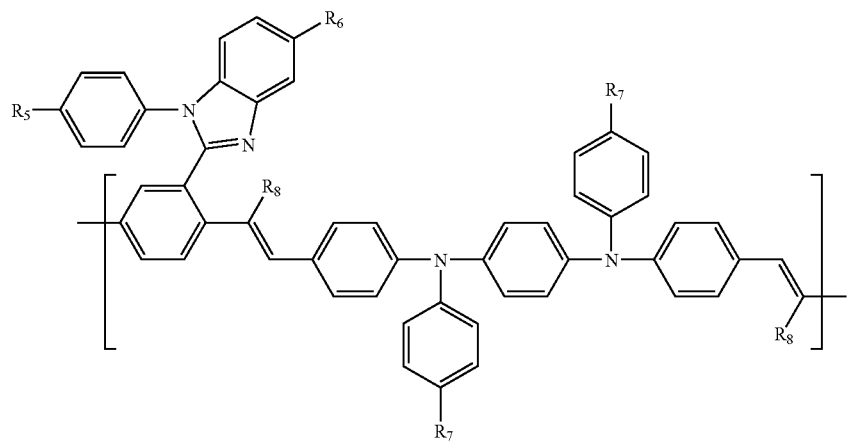

polymer 154 R$_5$=R$_6$=n-hexyl, R$_7$=t-butyl, R$_8$=H polymer 155 R$_5$=2-ethylhexyl, R$_6$=n-hexyl, R$_7$=4-t-butylphenyl, R$_8$=CN polymer 156 R$_5$=R$_6$=n-hexyoxy, R$_7$=t-butyl, R$_8$=phenyl polymer 157 R$_5$=n-hexyl, R$_6$=H, R$_7$=(4-diphenylamino)phenyl, R$_8$=CN

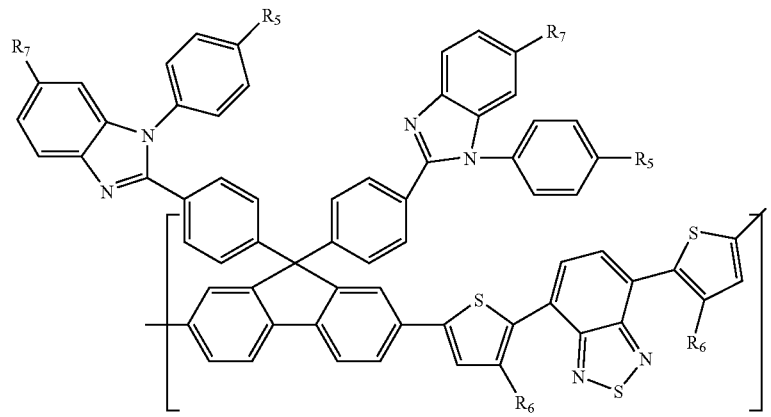

polymer 158 R$_5$=R$_6$=n-hexyl, R$_7$=t-butyl polymer 159 R$_5$=R$_6$=2-ethylhexyl, R$_7$=4-t-butylphenyl polymer 160 R$_5$=n-hexyoxy, R$_6$=n-hexyl, R$_7$=H polymer 161 R$_5$=n-hexyl, R$_6$=H, R$_7$=(4-diphenylamino)phenyl

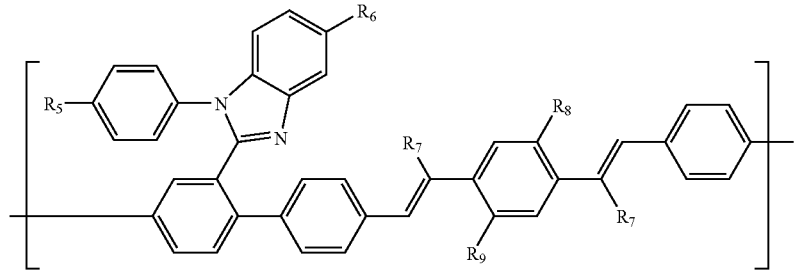

polymer 162 R$_5$=R$_6$=n-hexyl, R$_7$=phenyl, R$_8$=R$_9$=2-ethylhexyl polymer 163 R$_5$=2-ethylhexyl, R$_6$=n-hexyl, R$_7$=R$_8$=H, R$_9$=4-t-butylphenyl polymer 164 R$_5$=R$_6$=n-hexyl, R$_7$=H, R$_8$=methoxy, R$_9$=3,7-dimethyloctyloxy polymer 165 R$_5$=n-hexyl, R$_6$=R$_8$=3,7-dimethyloctyl, R$_7$=H, R$_9$=(4-diphenylamino)phenyl

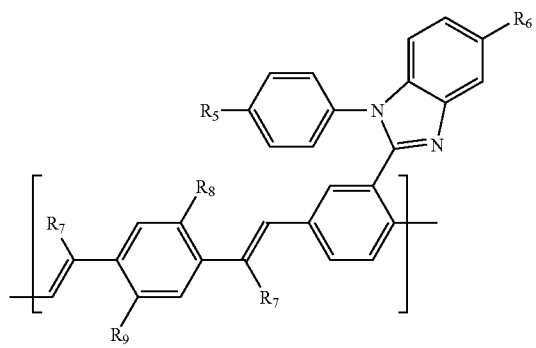

polymer 166 R$_5$=R$_6$=n-hexyl, R$_7$=phenyl, R$_8$=R$_9$=2-ethylhexyl polymer 167 R$_5$=2-ethylhexyl, R$_6$=n-hexyl, R$_7$=R$_8$=H, R$_9$=4-t-butylphenyl polymer 168 R$_5$=R$_6$=n-hexyl, R$_7$=H, R$_8$=methoxy, R$_9$=3,7-dimethyloctyloxy polymer 169 R$_5$=n-hexyl, R$_6$=R$_8$=3,7-dimethyloctyl, R$_7$=H, R$_9$=(4-diphenylamino)phenyl polymer 170 R$_5$=R$_6$=n-hexyl, R$_7$=phenyl, R$_8$=R$_9$=2-ethylhexyloxy

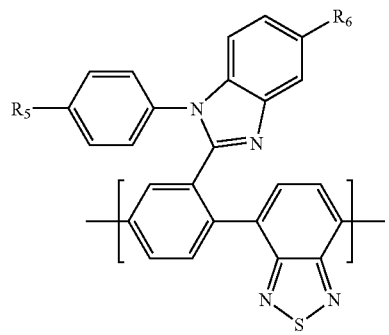

polymer 171 R$_5$=R$_6$=n-hexyl polymer 172 R$_5$=n-hexyloxy, R$_6$=4-(bis(4-methylphenyl)amino)phenyl polymer 173 R$_5$=n-hexyl, R$_6$=2-ethylhexyl polymer 174 R$_5$=H, R$_6$=n-hexyloxy polymer 175 R$_5$=trifluoromethyl, R$_6$=3,7-dimethyloctyl

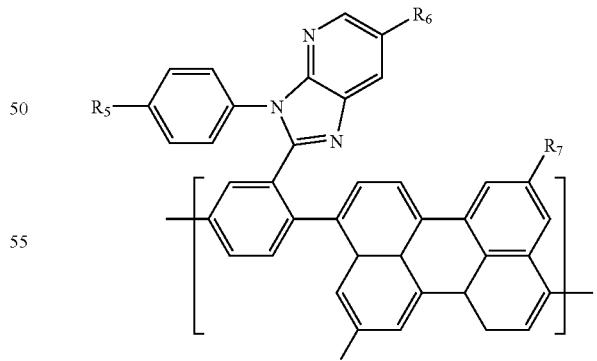

polymer 176 R$_5$=R$_6$=n-hexyl, R$_7$=t-butyl polymer 177 R$_5$=R$_6$=2-ethylhexyl, R$_7$=4-t-butylphenyl polymer 178 R$_5$=n-hexyoxy, R$_6$=n-hexyl, R$_7$=H polymer 179 R$_5$=n-hexyl, R$_6$=H, R$_7$=(4-diphenylamino)phenyl

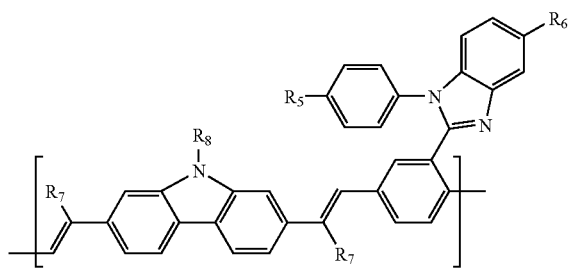

polymer 180 R$_5$=R$_6$=n-hexyl, R$_7$=phenyl, R$_8$=2-ethylhexyl polymer 181 R$_5$=2-ethylhexyl, R$_6$=n-hexyl, R$_7$=H, R$_8$=4-t-butylphenyl polymer 182 R$_5$=n-hexyl, R$_6$=H, R$_7$=CN, R$_8$=3,7-dimethyloctyloxy polymer 183 R$_5$=n-hexyloxy, R$_6$=R$_8$=3,7-dimethyloctyl, R$_7$=H

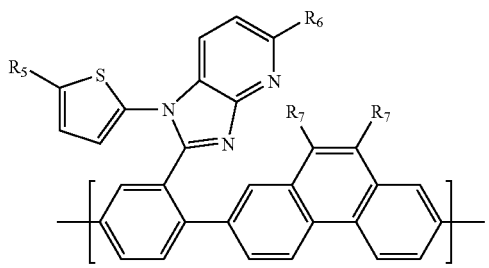

polymer 184 R$_5$=R$_6$=n-hexyl, R$_7$=t-butyl polymer 185 R$_5$=R$_6$=2-ethylhexyl, R$_7=_4$-t-butylphenyl polymer 186 R$_5$=n-hexyl, R$_6$=H, R$_7$=(4-diphenylamino)phenyl

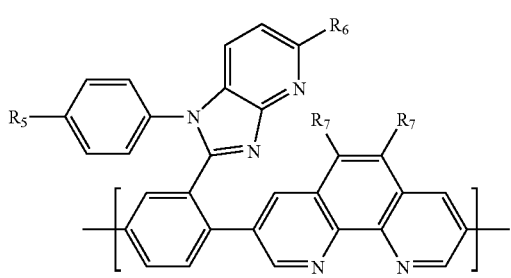

polymer 187 R$_5$=R$_6$=n-hexyl, R$_7$=t-butyl polymer 188 R$_5$=R$_6$=2-ethylhexyl, R$_7=_4$-t-butylphenyl polymer 189 R$_5$=n-hexyloxy, R$_6$=H, R$_7$=n-octyl polymer 190 R$_5$=n-hexyl, R$_6$=H, R$_7$=(4-diphenylamino)phenyl polymer 191 R$_5$=R$_7$=n-hexyloxy, R$_6$=H, (4-diphenylamino)phenyl

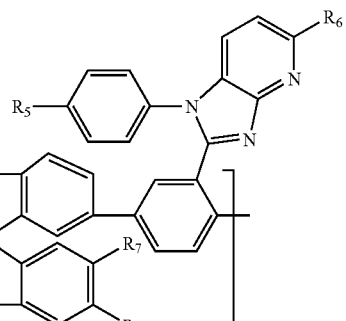

polymer 192 R$_5$=R$_6$=n-hexyl, R$_7$=H, R$_8$=2-ethylhexyloxy polymer 193 R$_5$=2-ethylhexyl, R$_6$=H, R$_7$=R$_8$=2-ethylhexyloxy polymer 194 R$_5$=R$_6$=n-hexyloxy, R$_7$=H, R$_8$=3,7-dimethyloctyloxy polymer 195 R$_5$=(4-diphenylamino)phenyl, R$_6$=R$_7$=R$_8$=3,7-dimethyloctyl

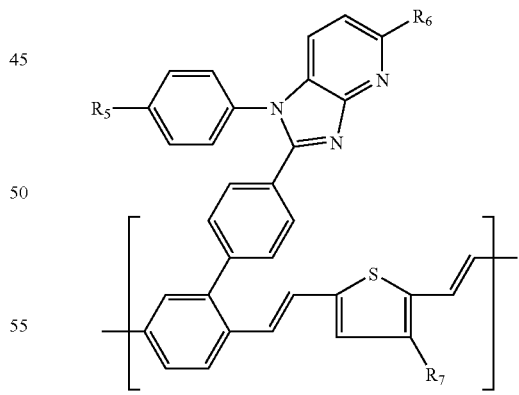

polymer 196 R$_5$=R$_6$=n-hexyl, R$_7$=t-butyl polymer 197 R$_5$=R$_6$=2-ethylhexyl, R$_7$=4-t-butylphenyl polymer 198 R$_5$=n-hexyoxy, R$_6$=H, R$_7$=n-octyl polymer 199 R$_5$=n-hexyl, R$_6$=H, R$_7$=(4-diphenylamino)phenyl

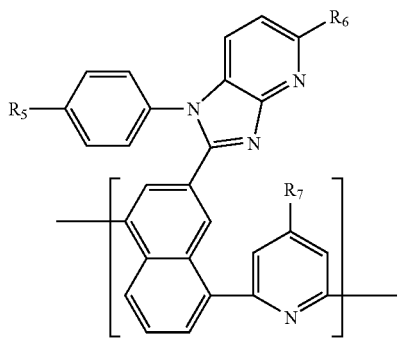

polymer 200 R₅=R₆=n-hexyl, R₇=dimethylamino polymer 201 R₅=R₆=2-ethylhexyl, R₇=4-t-butylphenyl polymer 202 R₅=n-hexyoxy, R₆=H, R₇=n-octyl polymer 203 R₅=H, R₆=n-hexyl, R₇=(4-diphenylamino)phenyl

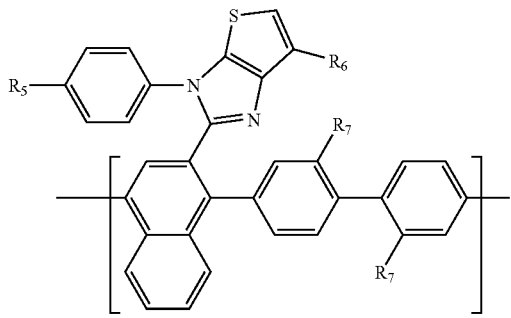

polymer 204 R₅=R₆=n-hexyl, R₇=dimethylamino polymer 205 R₅=R₇=2-ethylhexyloxy, R₆=2-ethylhexyl polymer 206 R₅=n-hexyloxy, R₆=H, R₇=n-octyl polymer 207 R₅=H, R₆=R₇=(4-diphenylamino)phenyl

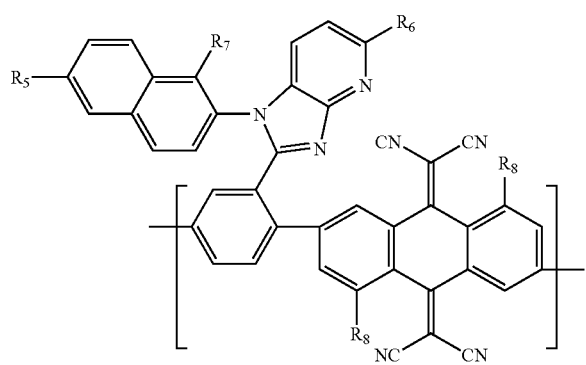

polymer 208 R₅=R₆=n-hexyl, R₇=(4-t-butyl)phenyl, R₈=H polymer 209 R₅=R₇=4-(bis(4-methylphenyl)amino)phenyl, R₆=H, R₈=hexyloxy polymer 210 R₅=R₆=R₇=n-hexyloxy, R₈=2-ethylhexyl polymer 211 R₅=n-hexyloxy, R₆=2-ethylhexyl, R₇=t-butyl, R₈=H

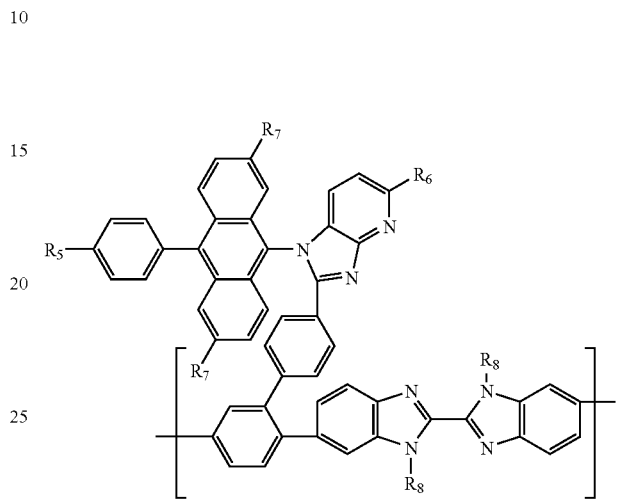

polymer 212 R₅=R₆=n-hexyl, R₇=2-ethylhexyloxy, R₈=phenyl polymer 213 R₅=R₇=4-(bis(4-methylphenyl)amino)phenyl, R₆=H, R₈=hexyl polymer 214 R₅=R₆=R₇=n-hexyloxy, R₈=2-ethylhexyl polymer 215 R₅=n-hexyloxy, R₆=2-ethylhexyl, R₇=t-butyl, R₈=methyl

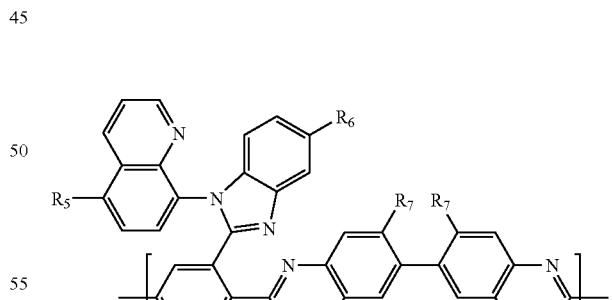

polymer 216 R₅=R₆=n-hexyl, R₇=dimethylamino polymer 217 R₅=R₆=2-ethylhexyloxy, R₇=4-t-butylphenyl polymer 218 R₅=n-hexyoxy, R₆=H, R₇=n-octyl polymer 219 R₅=H, R₆=R₇=(4-diphenylamino)phenyl

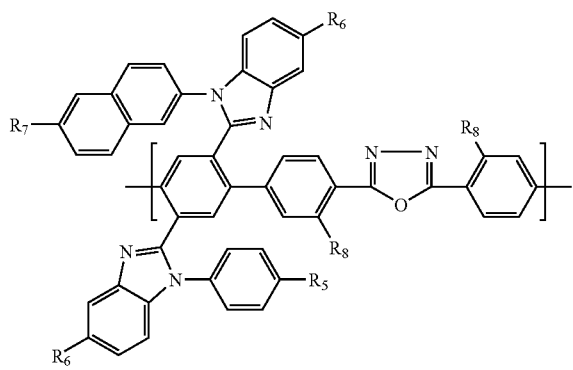

polymer 220 $R_5=R_6=R_7$=n-hexyl, $R_8$=(4-t-butyl)phenyl polymer 221 $R_5=R_6$=hexyloxy, $R_7$=4-(bis(4-methylphenyl)amino)phenyl, $R_8$=H polymer 222 $R_5=R_6=R_7$=n-hexyloxy, $R_8$=2-ethylhexyl polymer 223 $R_5$=n-hexyloxy, $R_6$=2-ethylhexyl, $R_7$=H, $R_8$=di-tolylamino

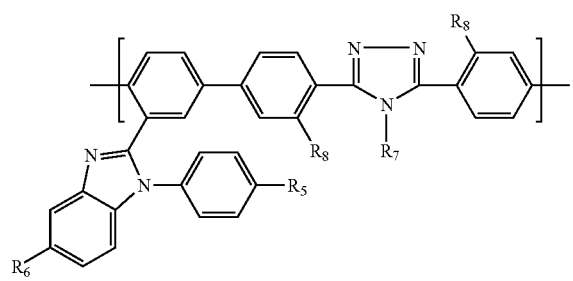

polymer 224 $R_5=R_6=R_7$=n-hexyl, $R_8$=(4-t-butyl)phenyl polymer 225 $R_5=R_6$=hexyloxy, $R_7$=4-(bis(4-methylphenyl)amino)phenyl, $R_8$=H polymer 226 $R_5$=n-hexyloxy, $R_6$=2-ethylhexyl, $R_7$=4-(di-tolylamino)phenyl, $R_8$=H polymer 227 $R_5=R_6$=n-hexyl, $R_7$=dimethylamino polymer 228 $R_5=R_6=R_7$=2-ethylhexyloxy, 4-t-butylphenyl polymer 229 $R_5$=n-hexyoxy, $R_6$=H, $R_7$=n-octyl polymer 230 $R_5$=H, $R_6=R_7$=(4-ditolylamino)phenyl

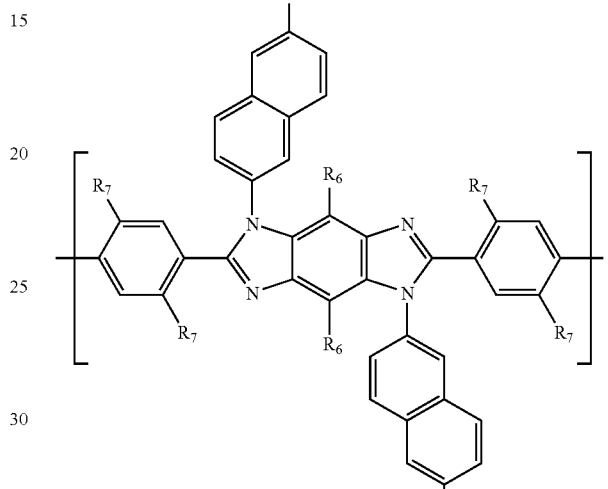

polymer 231 $R_5=R_6$=n-hexyl, $R_7$=hexyloxy polymer 232 $R_5$=2-ethylhexyl, $R_6$=H, $R_7$=(4-diphenylamino)phenyl polymer 233 $R_5$=n-hexyoxy, $R_6$=octyl, $R_7$=H polymer 234 $R_5$=n-hexyl, $R_6$=H, $R_7$=4-octylphenyl

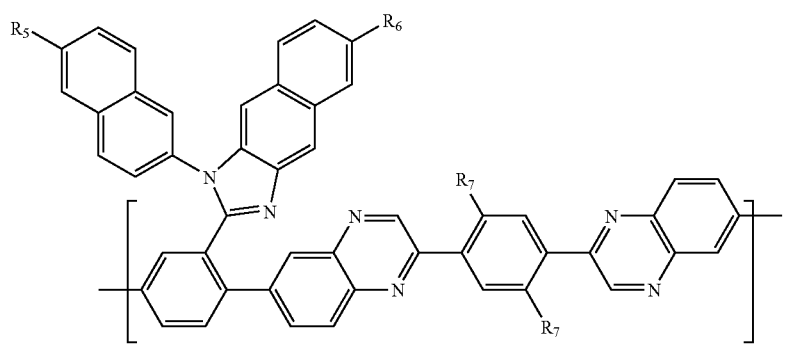

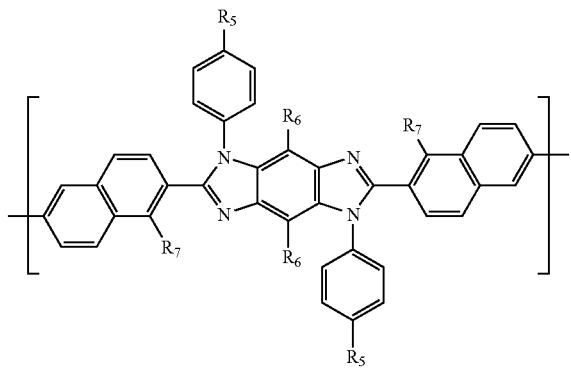

polymer 235 R₅=R₆=R₇=n-hexyl polymer 236 R₅=2-ethylhexyl, R₆=R₇=(4-diphenylamino)phenyl polymer 237 R₅=n-hexyloxy, R₆=octyl, R₇=H polymer 238 R₅=di-tolylamino, R₆=H, R₇=4-octyl

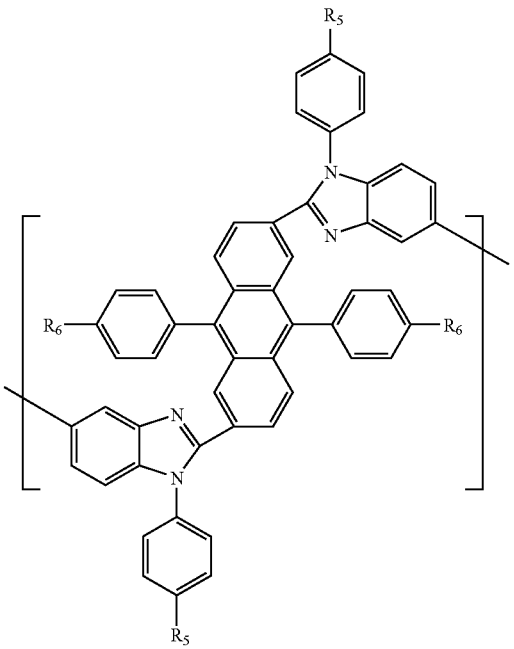

polymer 243 R₅=R₆=n-hexyl polymer 244 R₅=R₆=n-octyloxy polymer 245 R₅=2-ethylhexyl, R₆=(4-diphenylamino)phenyl polymer 246 R₅=n-hexyoxy, R₆=octyl polymer 247 R₅=4-octylphenyl, R₆=trifluoromethyl

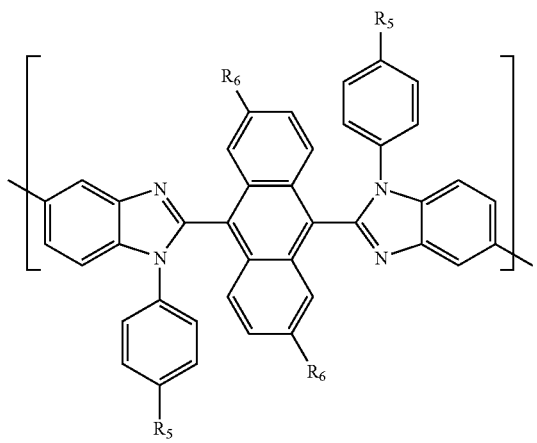

polymer 239 R₅=R₆=n-hexyl polymer 240 R₅=2-ethylhexyl, R₆=(4-diphenylamino)phenyl polymer 241 R₅=R₆=n-hexyloxy polymer 242 R₅=di-tolylamino, R₆=octyloxy

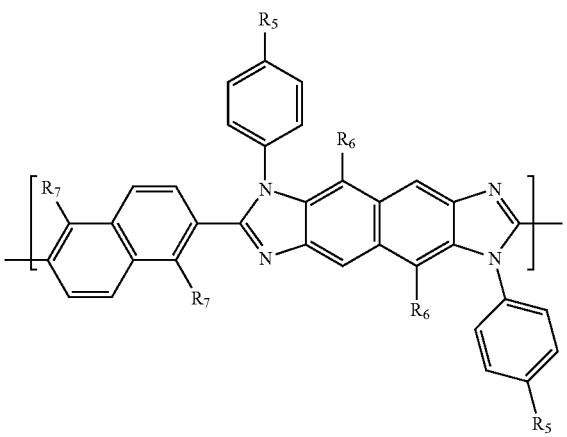

polymer 248 R₅=R₆=n-hexyl, R₇=hexyloxy polymer 249 R₅=2-ethylhexyl, R₆=H, R₇=(4-diphenylamino)phenyl polymer 250 R₅=n-hexyloxy, R₆=octyl, R₇=H polymer 251 R₅=H, R₆=octyloxy, R₇=4-octylphenyl

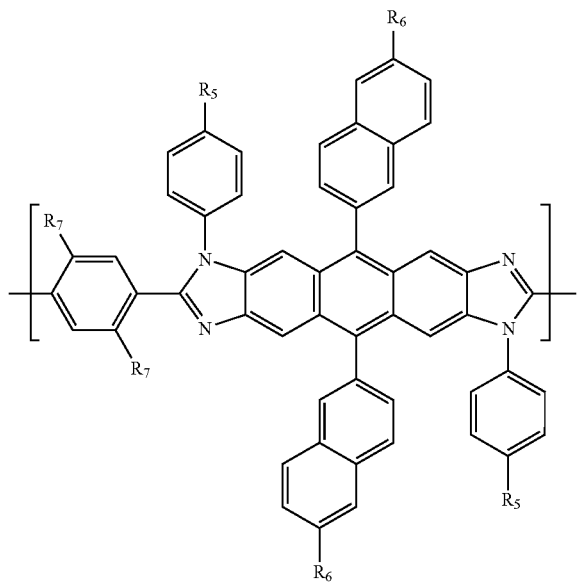

polymer 252 R$_5$=R$_6$=n-hexyl, R$_7$=hexyloxy polymer 253 R$_5$=R$_6$=R$_7$=hexyloxy polymer 254 R$_5$=2-ethylhexyl, R$_6$=H, R$_7$=(4-diphenylamino)phenyl polymer 255 R$_5$=H, R$_6$=3,7-dimethyloctyl, R$_7$=hexyloxy polymer 256 R$_5$=ditolylamino, R$_6$=4-octylphenyl, R$_7$=H

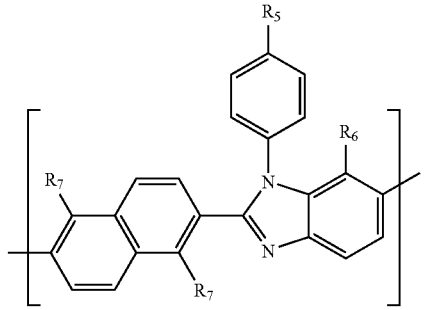

polymer 257 R$_5$=R$_6$=n-hexyl, R$_7$=hexyloxy polymer 258 R$_5$=R$_6$=R$_7$=hexyloxy polymer 259 R$_5$=2-ethylhexyl, R$_6$=H, R$_7$=(4-diphenylamino)phenyl polymer 260 R$_5$=H, R$_6$=hexyloxy, R$_7$=3,7-dimethyloctyl

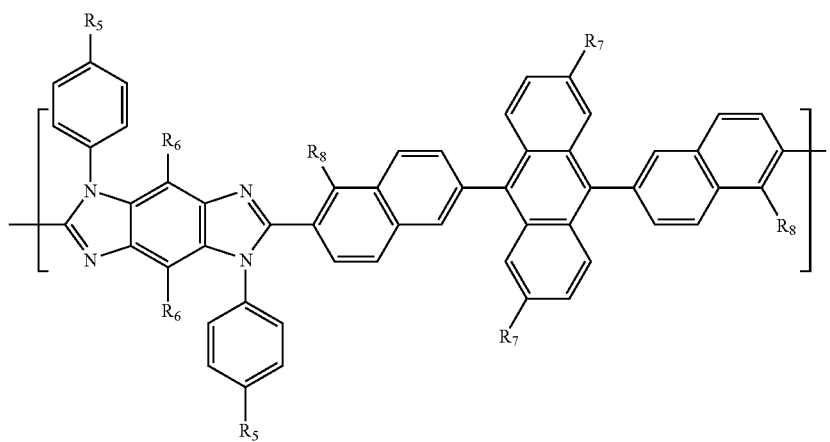

polymer 261 R$_5$=R$_6$=n-hexyl, R$_7$=hexyloxy polymer 262 R$_5$=R$_6$=R$_7$=hexyloxy polymer 263 R$_5$=2-ethylhexyl, R$_6$=H, R$_7$=(4-diphenylamino)phenyl polymer 264 R$_5$=H, R$_6$=hexyloxy, R$_7$=3,7-dimethyloctyl polymer 265 R₅=R₆=R₇=n-hexyl, R₈=t-butyl polymer 266 R₅=R₆=hexyloxy, R₇=4-(bis(4-methylphenyl)amino)phenyl, R₈=H polymer 267 R₅=R₆=R₇=n-hexyloxy, R₈=2-ethylhexyl polymer 268 R₅=H, R₆=2-ethylhexyl, R₇=3,7-dimethyloctyl, R₈=di-tolylamino

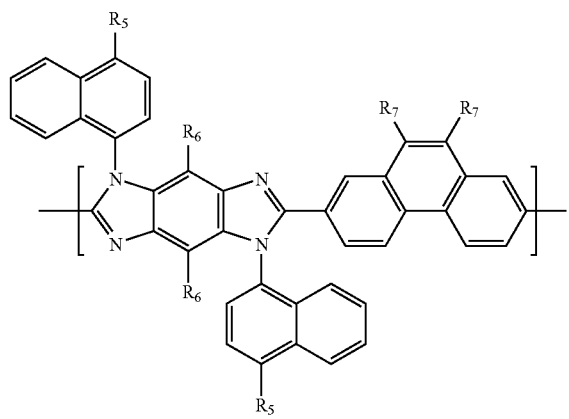

polymer 269 R₅=R₆=R₇=n-hexyl polymer 270 R₅=R₆=R₇=hexyloxy polymer 271 R₅=2-ethylhexyl, R₆=H, R₇=(4-diphenylamino)phenyl polymer 272 R₅=H, R₆=hexyloxy, R₇=3,7-dimethyloctyl

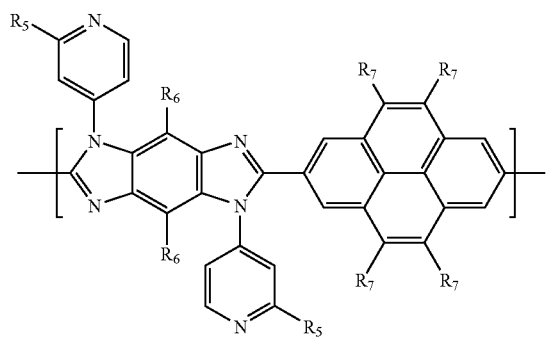

polymer 273 R₅=R₆=n-hexyl, R₇=hexyloxy polymer 274 R₅=H, R₆=octyloxy, R₇=4-t-butylphenyl polymer 275 R₅=2-ethylhexyl, R₆=H, R₇=(4-diphenylamino)phenyl polymer 276 R₅=n-hexyloxy, R₆=octyl, R₇=t-butyl

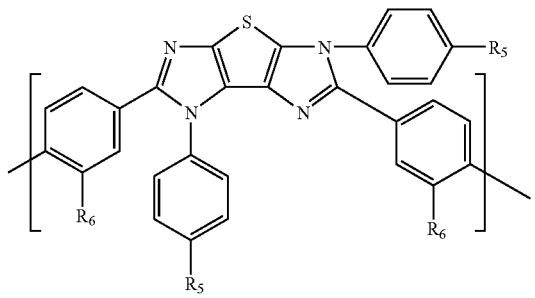

polymer 277 R₅=R₆=n-hexyl polymer 278 R₅=2-ethylhexyl, R₆=(4-diphenylamino)phenyl polymer 279 R₅=R₆=n-hexyloxy polymer 280 R₅=di-tolylamino, R₆=3,7-dimethyloctyloxy

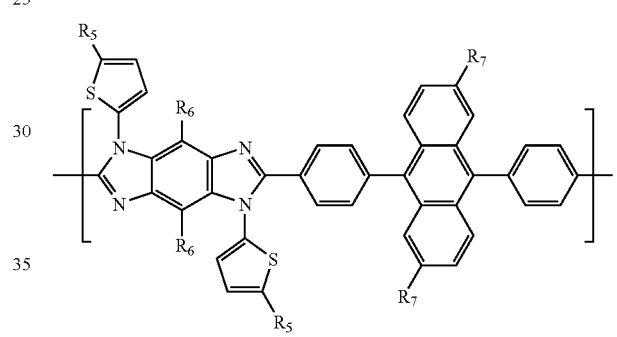

polymer 281 R₅=R₆=R₇=n-hexyl polymer 282 R₅=2-ethylhexyl, R₆=H, R₇=(4-diphenylamino)phenyl polymer 283 R₅=H, R⁶=hexyloxy, R₇=3,7-dimethyloctyl

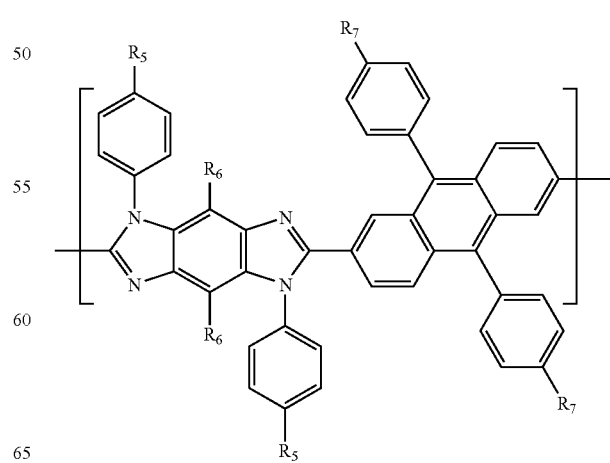

polymer 284 R$_5$=R$_6$=R$_7$=n-hexyl polymer 285 R$_5$=R$_6$=R$_7$=hexyloxy polymer 286 R$_5$=2-ethylhexyl, R$_6$=H, R$_7$=(4-diphenylamino)phenyl polymer 287 R$_5$=H, R$_6$=hexyloxy, R$_7$=3,7-dimethyloctyloxy

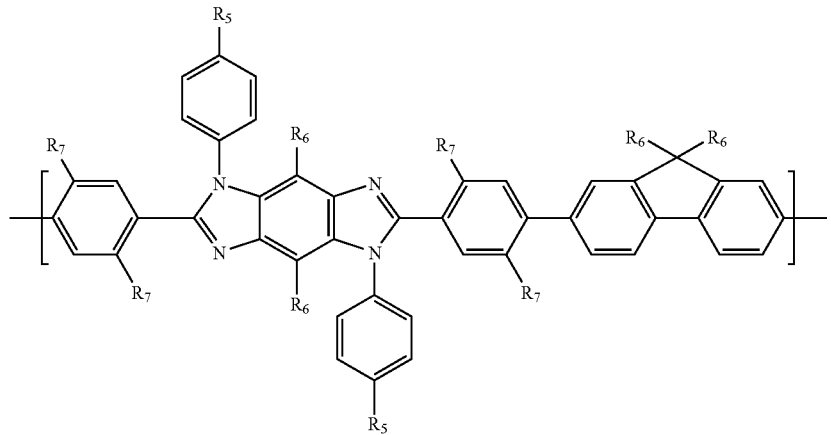

polymer 288 R$_5$=R$_6$=n-hexyl, R$_7$=hexyloxy polymer 289 R$_5$=H, R$_6$=tolyl, R$_{7=4}$-octylphenyl polymer 290 R$_5$=2-ethylhexyl, R$_6$=(4-diphenylamino)phenyl, R$_7$=H polymer 291 R$_5$=n-hexyloxy, R$_6$=octyl, R$_7$=t-butyl

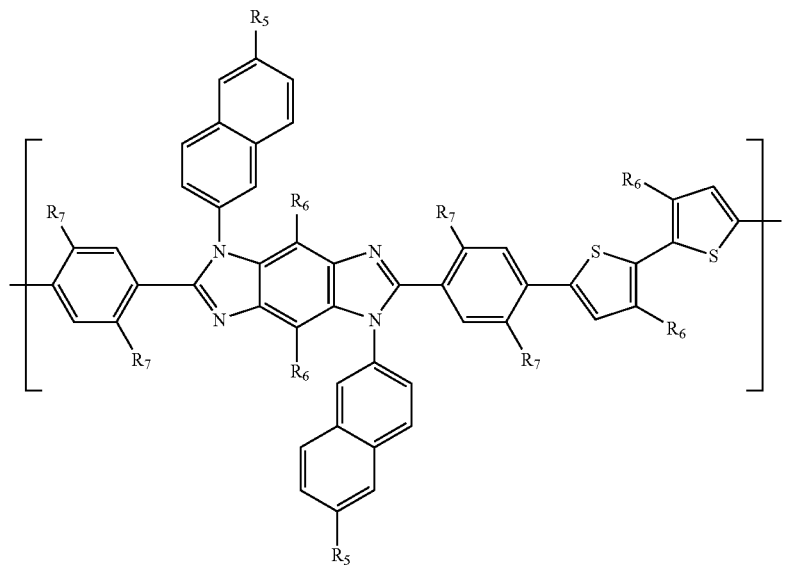

polymer 292 R$_5$=R$_6$=R$_7$=n-hexyl polymer 293 R$_5$=2-ethylhexyloxy, R$_6$=H, R$_7$=(4-diphenylamino)phenyl polymer 294 R$_5$=R$_7$=3,7-dimethyloctyl, R$_6$=H

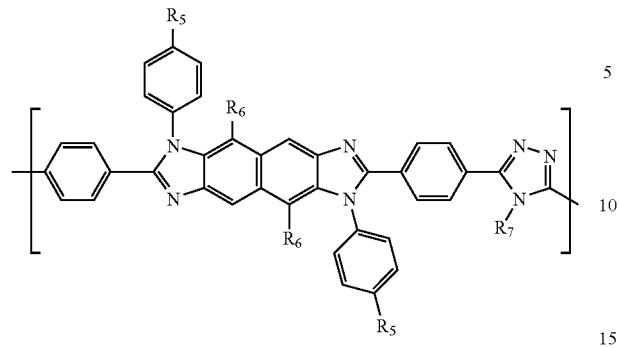
polymer 295 R₅=R₆=R₇=n-hexyl
polymer 296 R₅=2-ethylhexyl, R₆=H, R₇=(4-diphenylamino)phenyl
polymer 297 R₅=H, R₆=hexyloxy, R₇=3,7-dimethyloctyloxy
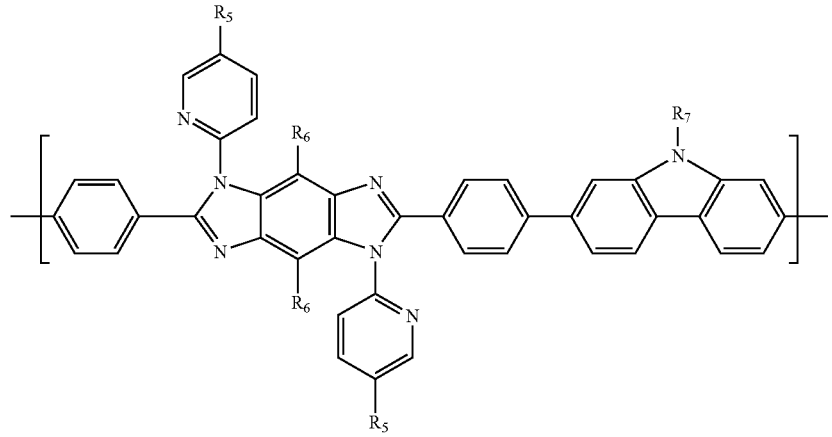
polymer 298 R₅=R₆=R₇=n-hexyl,
polymer 299 R₅=H, R₆=octyl, R₇=4-octylphenyl
polymer 300 R₅=2-ethylhexyl, R₆=H, R₇=ditolylaminophenyl
polymer 301 R₅=n-hexyloxy, R₆=R₇=octyl
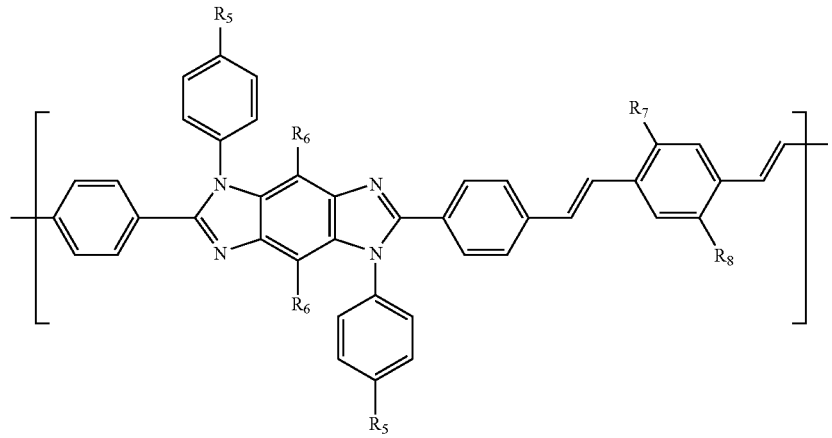

polymer 302 $R_5=R_6=R_7=R_8$=n-hexyl polymer 303 $R_5=R_6$=hexyloxy, $R_7$=4-(bis(4-methylphenyl)amino)phenyl, $R_8$=H polymer 304 $R_5=R_6=R_7$=n-hexyloxy, $R_8$=methoxy polymer 305 $R_5$=H, $R_6$=2-ethylhexyl, $R_7$=3,7-dimethyloctyl, $R_8$=trifluoromethyl

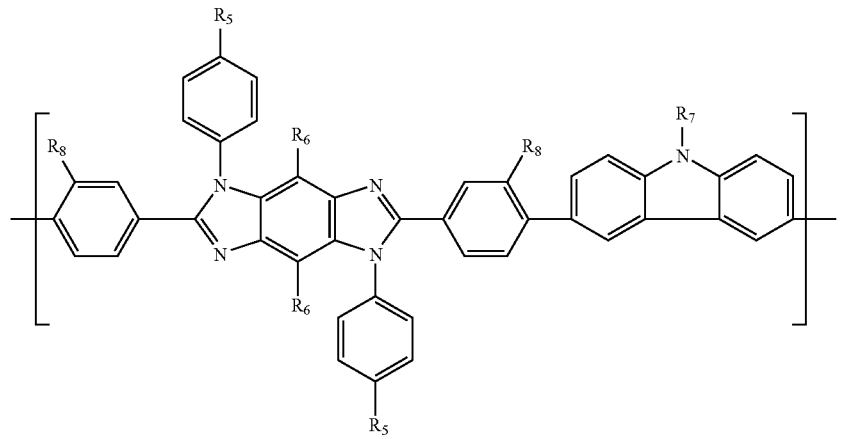

polymer 306 $R_5=R_6=R_7$=n-hexyl, $R_8$=H polymer 307 $R_5=R_6=R_8$=hexyloxy, $R_7$=4-(t-butylphenyl)

polymer 308 $R_5$=2-ethylhexyl $R_6$=H, $R_7$=3,7-dimethyloctyl, $R_8$=di-tolylamino

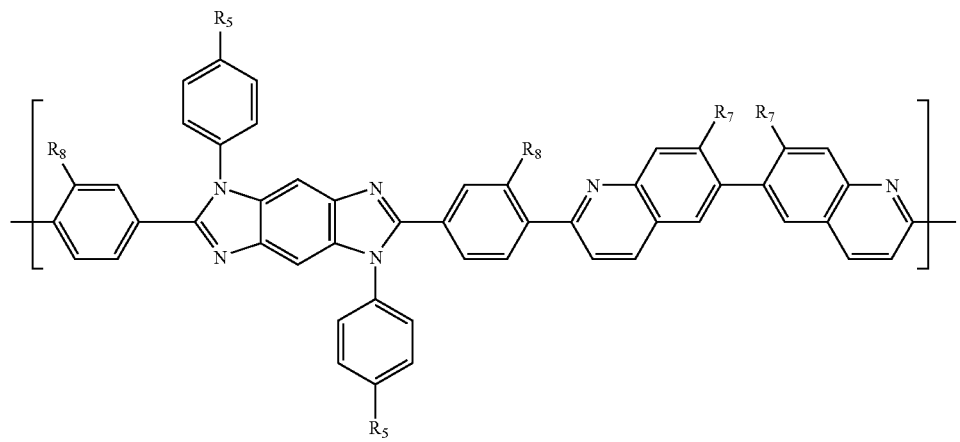

polymer 309 $R_5=R_6=R_7$=n-hexyl polymer 310 $R_5=R_6$=octyloxy, $R_7$=4-octylphenyl polymer 311 $R_5$=2-ethylhexyl, $R_6$=H, $R_7$=ditolylaminophenyl polymer 312 $R_5$=n-hexyloxy, $R_6=R_7$=octyl

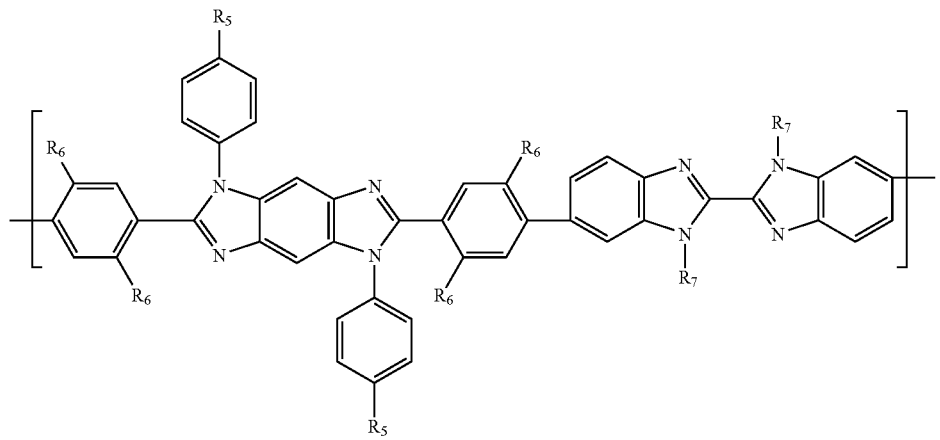

polymer 313 R$_5$=R$_6$=R$_7$=n-hexyl
polymer 314 R$_5$=R$_6$=octyloxy, R$_7$=4-octylphenyl
polymer 315 R$_5$=2-ethylhexyl, R$_6$=H, R$_7$=octyl polymer 320 R$_5$=R$_6$=R$_7$=n-hexyl
polymer 321 R$_5$=R$_6$=R$_7$=octyloxy

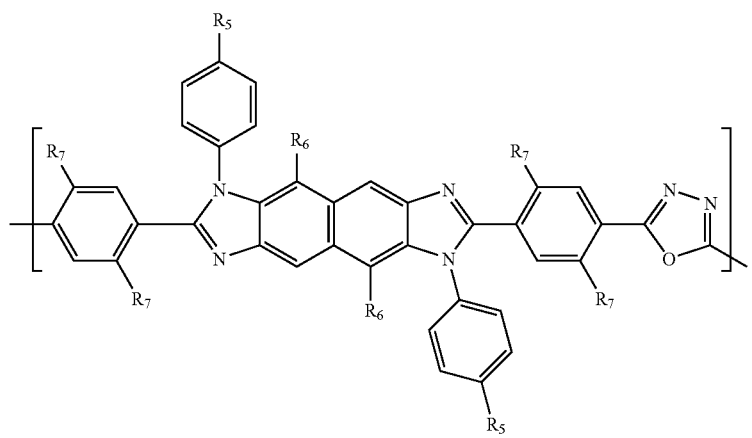

polymer 316 R$_5$=R$_6$=R$_7$=n-hexyl,
polymer 317 R$_5$=hexyl, R$_6$=octyloxy, R$_7$=4-t-butylphenyl
polymer 318 R$_5$=2-ethylhexyl, R$_6$=H, R$_7$=octyloxy
polymer 319 R$_5$=R$_6$=H, R$_7$=octyloxy polymer 322 R$_5$=2-ethylhexyl, R$_6$=ditolylaminophenyl, R$_7$=H polymer 323 R$_5$=n-hexyloxy, R$_6$=H, R$_7$=octyl

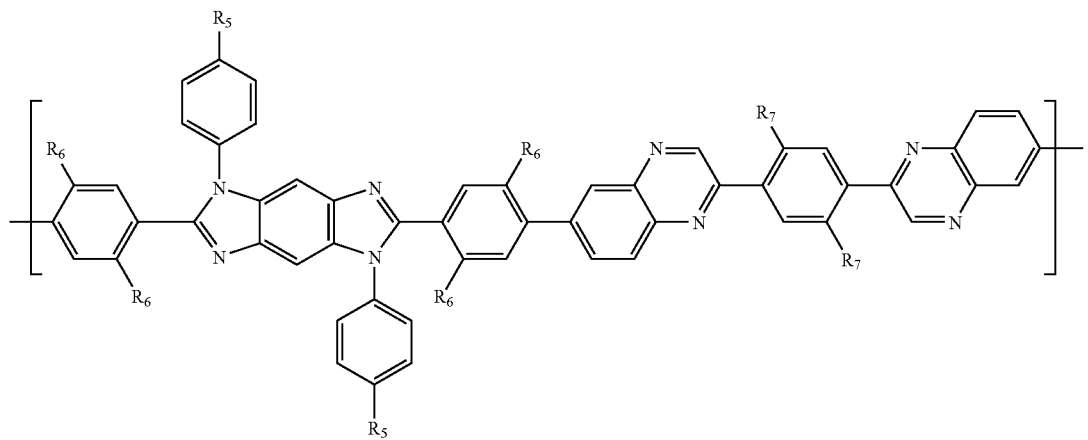

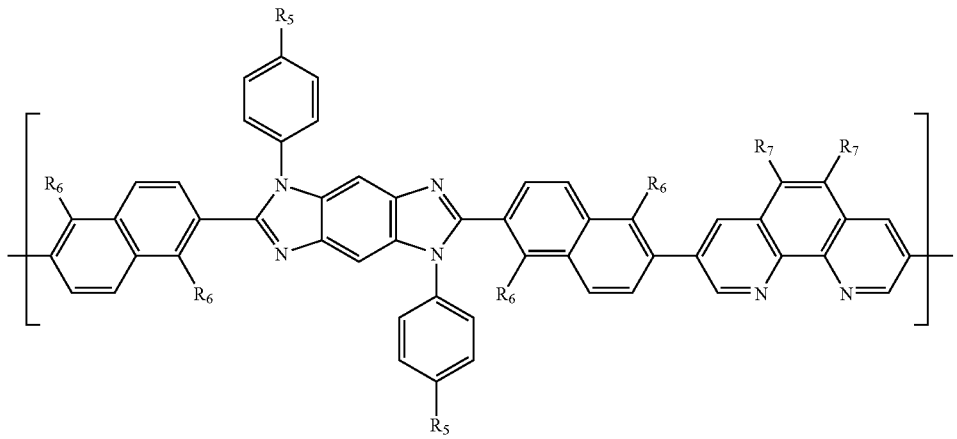

polymer 324 R$_5$=2-ethylhexyl, R$_6$=hexyloxy, R$_7$=t-butyl polymer 325 R$_5$=R$_6$=R$_7$=n-hexyl polymer 326 R$_5$=R$_6$=R$_7$=octyloxy polymer 327 R$_5$=methyl, R$_6$=3,7-dimethyloctyl, R$_7$=ditolylaminophenyl polymer 332 R$_5$=n-hexyl polymer 333 R$_5$=3,7-dimethyloctyloxy polymer 334 R$_5$=bis(4-octylphenylamino)

polymer 335 R$_5$=H, R$_6$=hexyloxy

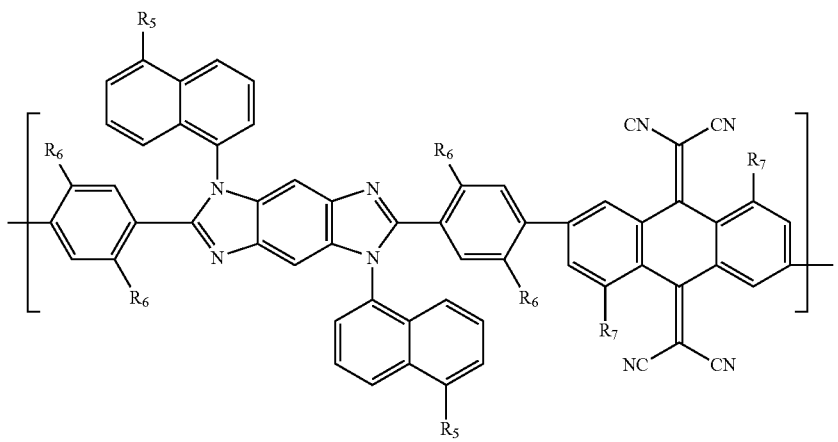

polymer 328 R$_5$=R$_6$=R$_7$=n-hexyl polymer 329 R$_5$=R$_6$=R$_7$=hexyloxy polymer 330 R$_5$=2-ethylhexyl, R$_6$=(4-diphenylamino)phenyl, R$_7$=H polymer 331 R$_5$=R$_7$=H, R$_6$=3,7-dimethyloctyloxy

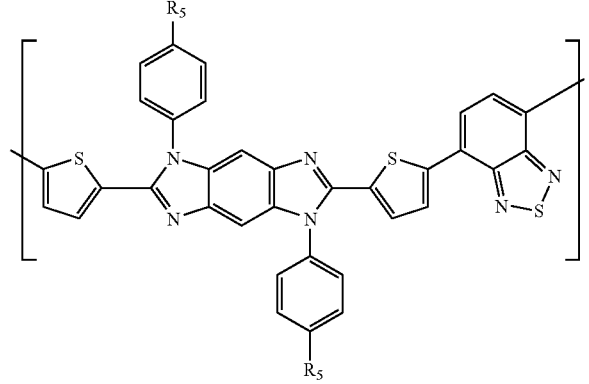

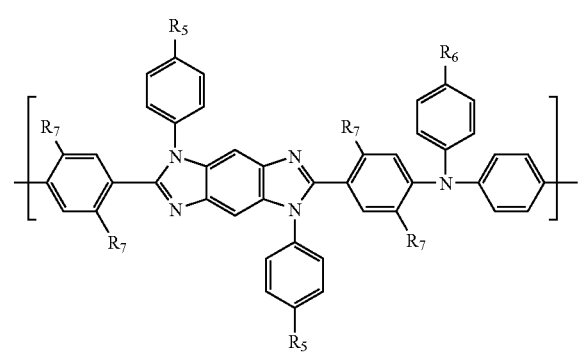

polymer 336 R$_5$=R$_6$=R$_7$=n-hexyl polymer 337 R$_5$=R$_6$=R$_7$=hexyloxy polymer 338 R$_5$=2-ethylhexyl, R$_6$=(4-di-tolylamino), R$_7$=H polymer 339 $R_5$=H, $R_6$=hexyloxy, $R_7$=3,7-dimethyloctyloxy

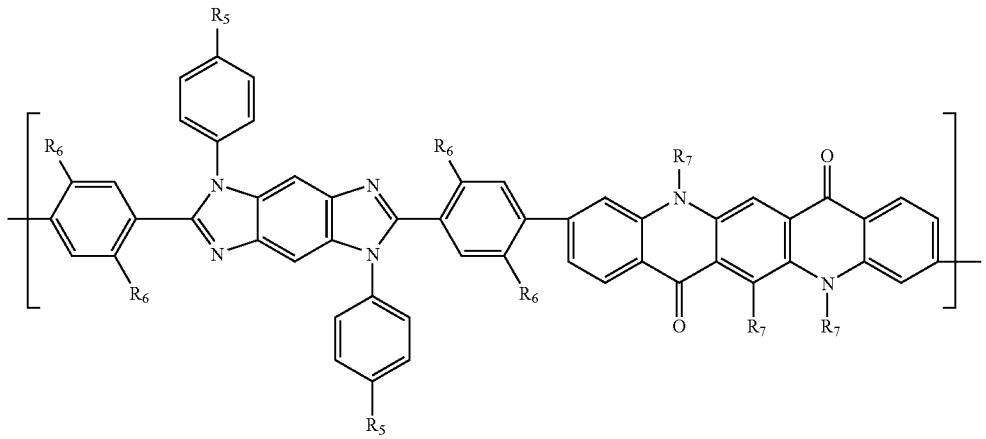

polymer 340 $R_5$=$R_6$=$R_7$=n-hexyl polymer 341 $R_5$=2-ethylhexyl, $R_6$=H, $R_7$=4-octylphenyl polymer 342 $R_5$=H, $R_6$=hexyloxy, $R_7$=3,7-dimethyloctyl

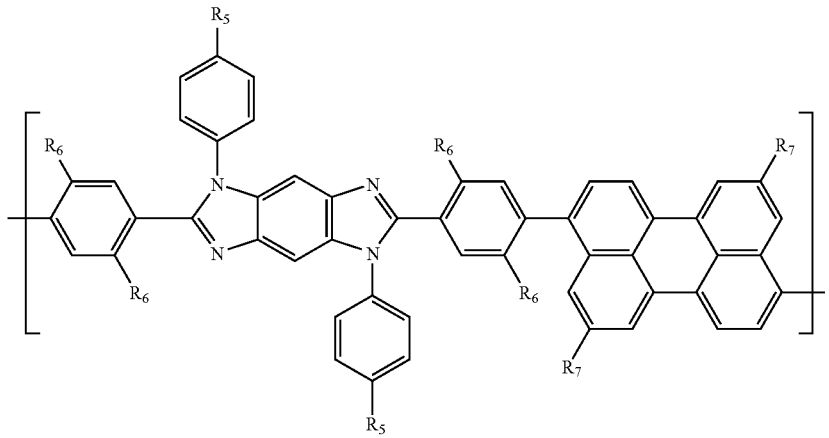

polymer 343 $R_5$=$R_6$=$R_7$=n-hexyl polymer 344 $R_5$=$R_6$=$R_7$=hexyloxy polymer 345 $R_5$=2-ethylhexyl, $R_6$=H, $R_7$=4-octylphenyl polymer 346 $R_5$=H, $R_6$=(4-octylphenyl)amino, $R_7$=3,7-dimethyloctyloxy The specific molecular structures can be the combination of any of the above drawn structures.

The conjugated polymers comprising azole structure (I) can be synthesized using known methods. The polymerization method and the molecular weights of the resulting polymers used in the present invention are not necessary to be particularly restricted. The molecular weights of the polymers are at least 1000, and preferably at least 2000. The polymers may be prepared by condensation polymerizations, such as coupling reactions including Pd-catalyzed Suzuki coupling, Stille coupling or Heck coupling, or Ni-mediated Yamamoto coupling, or by other condensation methods such as Wittig reaction, or Homer-Emmons reaction, or Knoevenagel reaction, or dehalogenation of dibenzyl halides. Preferably the polymers are prepared by Suzuki coupling reaction.

Suzuki coupling reaction was first reported by Suzuki et al on the coupling of aromatic boronic acid derivatives with aromatic halides (Suzuki, A. et al *Synthetic Comm.* 1981, 11(7), 513). Since then, this reaction has been widely used to prepared polymers for various applications (Ranger, M. et al *Macromolecules* 1997, 30, 7686). The reaction involves the use of a palladium-based catalyst such as a soluble Pd compound either in the state of Pd (II) or Pd (0), a base such as an aqueous inorganic alkaline carbonate or bicarbonate, and a solvent for the reactants and/or product. The preferred Pd catalyst is a Pd (0) complex such as $Pd(PPh_3)_4$ or a Pd (II) salt such as $Pd(PPh_3)_2Cl_2$ or $Pd(OAc)_2$ with a tertiary phosphine ligand, and used in the range of 0.01-10 mol % based on the functional groups of the reactants. Polar solvents such as THF and non-polar solvents toluene can be used however, the non-polar solvent is believed to slow down the reaction. Modified processes were reported to prepare conjugated polymers for EL devices from the Suzuki coupling of aromatic halides and aromatic boron derivatives (Inbasekaran, M. et al U.S. Pat. No. 5,777,070 (1998); Towns, C. R. et al. PCT WO00/53656, 2000). A variation of the Suzuki coupling reaction replaces the aromatic halide with an aromatic trifluoromethanesulfonate (triflate) (Ritter, K. Synthesis, 1993, 735). Aromatic triflates are readily prepared from the corresponding phenol derivatives. The advantages of using aromatic triflates are that the phenol derivatives are easily accessible and can be protected/deprotected during complex synthesis. For example, aromatic halides normally would react under various coupling conditions to generate unwanted by-product and lead to much more complicated synthetic schemes. However, phenol derivatives can be easily protected by various protecting groups that would not interfere with functional group transformation and be deprotected to generate back the phenol group which then can be converted to triflates. The diboron derivatives can be prepared from the corresponding dihalide or ditriflate.

The synthetic schemes of the polymers according to the present invention are illustrated in Schemes 1-4.

The process of the invention provides conjugated polymers particularly useful for an optical device. The optical device may include a luminescent device such as an EL device in which the polymers of the present invention is deposited between a cathode and an anode. The polymers can be deposited as thin film by vapor deposition method or thermal transfer, or from a solution by spin-coating, spray-coating, dip-coating, roller-coating, or ink jet delivery. The thin film may be supported by substrate directly, preferably a transparent substrate, or supported by the substrate indirectly where there is one or more inter layers between the substrate and thin film. The thin film can be used as emitting layer or charge carrier transporting layer, especially electron transporting layer.

General EL Device Architecture:

The present invention can be employed in most organic EL device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. A typical structure is shown in FIG. 1 and includes a substrate 101, an anode 103, a hole-injecting layer 105, a hole-transporting layer 107, a light-emitting layer 109, an electron-transporting layer 111, and a cathode 113. These layers are described in detail below. This figure is for illustration only and the individual layer thickness is not scaled according to the actual thickness. Note that the substrate may alternatively be located adjacent to the cathode, or the substrate may actually constitute the anode or cathode. The organic layers between the anode and cathode are conveniently referred to as the organic EL element.

The anode 103 and cathode 113 of the OLED are connected to a voltage/current source 250 through electrical conductors 260. The OLED is operated by applying a potential between the anode 103 and cathode 113 such that the anode 103 is at a more positive potential than the cathode 113. Holes are injected into the organic EL element from the anode 103 and electrons are injected into the organic EL element at the anode 103. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate:

The OLED device of this invention is typically provided over a supporting substrate 101 where either the cathode 113 or anode 103 can be in contact with the substrate 101. The electrode in contact with the substrate 101 is conveniently referred to as the bottom electrode. Conventionally, the bottom electrode is the anode, but this invention is not limited to that configuration. The substrate 101 can either be light transmissive or opaque, depending on the intended direction of light emission. The light transmissive property is desirable for viewing the EL emission through the substrate 101. Transparent glass or plastic is commonly employed in such cases. The substrate 101 may be a complex structure including multiple layers of materials. This is typically the case for active matrix substrates wherein TFTs are provided below the EL layers. It is still necessary that the substrate 101, at least in the emissive pixilated areas, be comprised of largely transparent materials such as glass or polymers. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Again, the substrate 101 may be a complex structure including multiple layers of materials such as found in active matrix TFT designs. Of course it is necessary to provide in these device configurations a light-transparent top electrode.

Anode:

When EL emission is viewed through anode 103, the anode 103 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode 103. Anode 103 can be modified with plasma-deposited fluorocarbons as disclosed in EP Patent 0914025. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Hole-Injection Layer (HIL):

While not always necessary, it is often useful that a hole-injecting layer 105 be provided between anode 103 and hole-transporting layer 107. The hole-injecting material can serve to improve the film formation property of subsequent organic layers and to facilitate injection of holes into the hole-transporting layer 107. Suitable materials for use in the hole-injecting layer 105 include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1.

Hole-Transporting Layer (HTL)

The hole-transporting layer 107 of the organic EL device in general contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or including at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural formula (A).

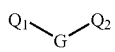
(A)

wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

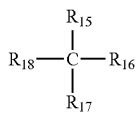
(B)

wherein:

$R_{15}$ and $R_{16}$ each independently represents a hydrogen atom, an aryl group, or an alkyl group or $R_{15}$ and $R_{16}$ together represent the atoms completing a cycloalkyl group; and $R_{17}$ and $R_{18}$ each independently represents an aryl group, which is in turn substituted with a diaryl substituted amino group, as indicated by structural formula (C):

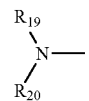
(C)

wherein $R_{19}$ and $R_{20}$ are independently selected aryl groups. In one embodiment, at least one of $R_{19}$ or $R_{20}$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D):

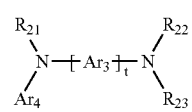
(D)

wherein each $Ar_3$ is an independently selected arylene group, such as a phenylene or anthracene moiety, t is an integer of from 1 to 4; and $Ar_4$, $R_{21}$, $R_{22}$, and $R_{23}$ are independently selected aryl groups.

In a typical embodiment, at least one of $Ar_4$, $R_{21}$, $R_{22}$, and $R_{23}$ is a polycyclic fused ring structure, e.g., a naphthalene.

The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—eg, cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one may employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N—(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting/hole injection materials can be used such as poly(N-vinylcarbazole) (PVK), polythiophenes, polypyrrole, polyaniline (Yang, Y. et al. *Appl. Phys. Lett.* 1994, 64, 1245) and copolymers such as poly(3,4-ethylenedioxythiophene)/poly(4-styrenesulfonate) also called PEDOT/PSS(Groenendaal, L. B. et al. *Adv. Mater.* 2000, 12, 481).

Light-Emitting Layer (LEL)

As more fully described in U.S. Pat. Nos. 4,769,292 and 5,935,721, the light-emitting layer (LEL) 109 of the organic EL element includes a luminescent or fluorescent material where electroluminescence is produced as a result of electron-hole pair recombination in this region. The light-emitting layer 119 can include a single material including both small molecules and polymers. For small molecules, more commonly the LEL consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Simultaneously, the color of the EL devices can be tuned using dopants of different emission wavelengths. By using a mixture of dopants, EL color characteristics of the combined spectra of the individual dopant are produced. This dopant scheme has been described in considerable detail for EL devices in U.S. Pat. No. 4,769,292 for fluorescent dyes. Dopants are typically coated as 0.01 to 10% by weight into the host material. Polymeric materials such as polyfluorenes and poly(arylene vinylenes) (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital (HOMO) and the lowest unoccupied molecular orbital (LUMO) of the molecule. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

For small molecules, host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721, and 6,020,078.

For example, small molecule metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

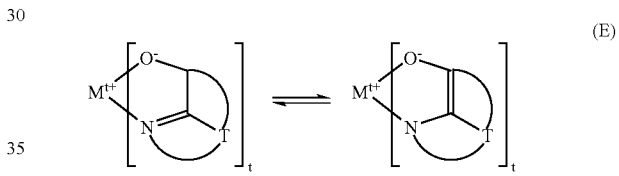

(E)

wherein:

M represents a metal;

t is an integer of from 1 to 4; and

T independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

T completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]

CO-2: Magnesium bisoxine [alias, bis(8-quinolinolato)magnesium(II)]

CO-3: Bis[benzo {f}-8-quinolinolato]zinc (II)

CO-4: Bis(2-methyl-8-quinolinolato)aluminum(III)-μ-oxo-bis(2-methyl-8-quinolinolato)aluminum(III)

CO-5: Indium trisoxine [alias, tris(8-quinolinolato)indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato)zirconium(IV)]

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

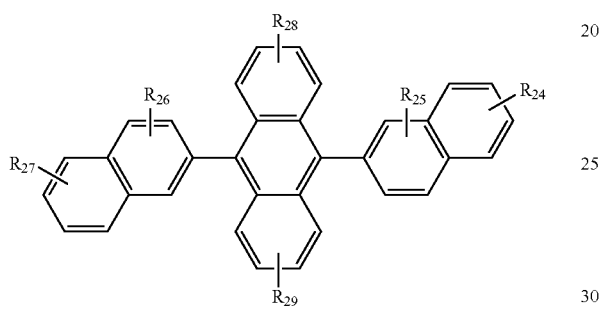

(F)

wherein: $R_{24}$, $R_{25}$, $R_{26}$, $R_{27}$, $R_{28}$, and $R_{29}$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Illustrative examples include 9,10-di-(2-naphthyl)anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

Distyrylarylene derivatives are also useful hosts, as described in U.S. Pat. No. 5,121,029. Carbazole derivatives are particularly useful hosts for phosphorescent emitters.

Useful fluorescent dopants (FD) include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds. Useful phosphorescent dopants (PD) include but are not limited to organometallic complexes of transition metals of iridium, platinum, palladium, or osmium. Illustrative examples of useful dopants include, but are not limited to, the following:

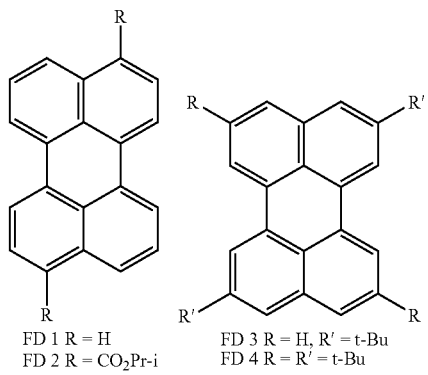

FD 1 R = H
FD 2 R = CO₂Pr-i

FD 3 R = H, R' = t-Bu
FD 4 R = R' = t-Bu

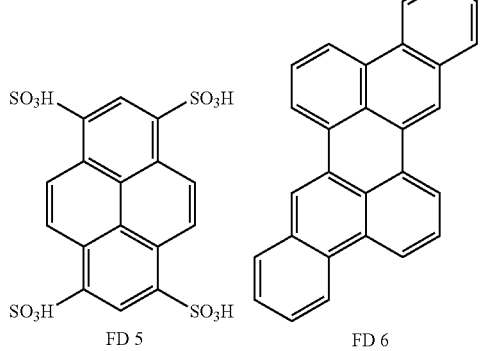

FD 5

FD 6

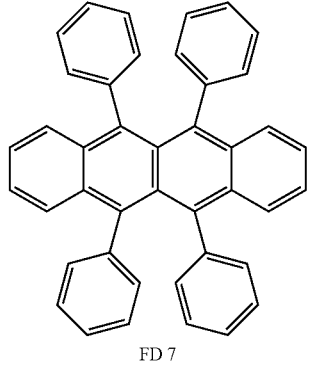

FD 7

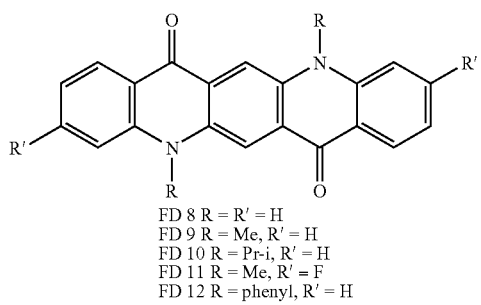

FD 8 R = R' = H
FD 9 R = Me, R' = H
FD 10 R = Pr-i, R' = H
FD 11 R = Me, R' = F
FD 12 R = phenyl, R' = H -continued

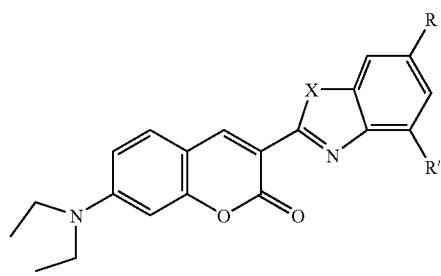

FD 13 R = R' = H, X = O
FD 14 R = H, R' = Me, X = O
FD 15 R = Me, R' = H, X = O
FD 16 R = Me, R' = Me, X = O
FD 17 R = H, R' = t-Bu, X = O
FD 18 R = t-Bu, R' = H, X = O
FD 19 R = R' = t-Bu, X = O
FD 20 R = R' = H, X = S
FD 21 R = H, R' = Me, X = S
FD 22 R = Me, R' = H, X = S
FD 23 R = Me, R' = Me, X = S
FD 24 R = H, R' = t-Bu, X = S
FD 25 R = t-Bu, R' = H, X = S
FD 26 R = R' = t-Bu, X = S

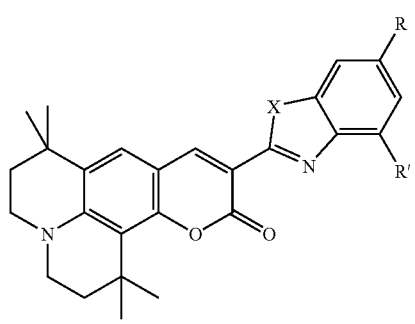

FD 27 R = R' = H, X = O
FD 28 R = H, R' = Me, X = O
FD 29 R = Me, R' = H, X = O
FD 30 R = Me, R' = Me, X = O
FD 31 R = H, R' = t-Bu, X = O
FD 32 R = t-Bu, R' = H, X = O
FD 33 R = R' = t-Bu, X = O
FD 34 R = R' = H, X = S
FD 35 R = H, R' = Me, X = S
FD 36 R = Me, R' = H, X = S
FD 37 R = Me, R' = Me, X = S
FD 38 R = H, R' = t-Bu, X = S
FD 39 R = t-Bu, R' = H, X = S
FD 40 R = R' = t-Bu, X = S

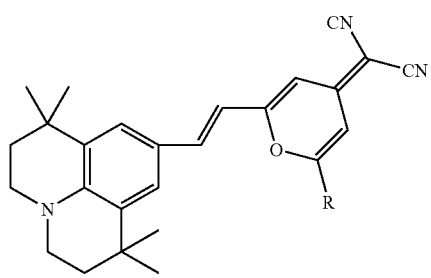

FD 41 R = phenyl
FD 42 R = Me
FD 43 R = t-Bu
FD 44 R = mesityl

-continued

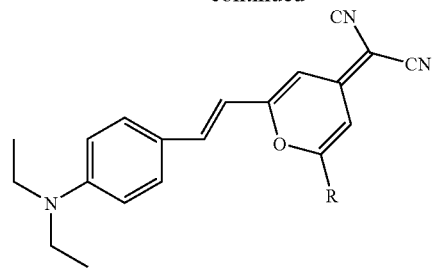

FD 45 R = phenyl
FD 46 R = Me
FD 47 R = t-Bu
FD 48 R = mesityl

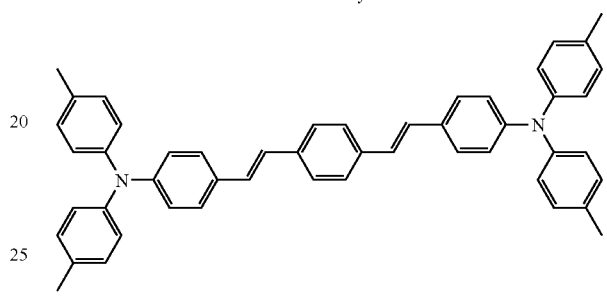

FD 49

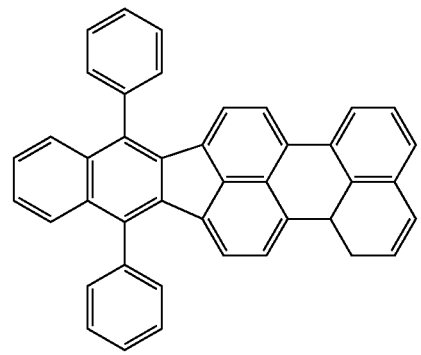

FD 50

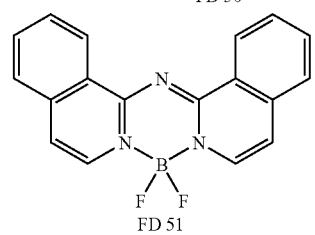

FD 51

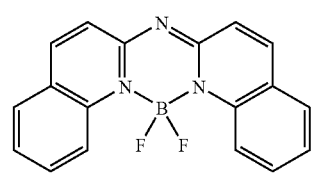

FD 52

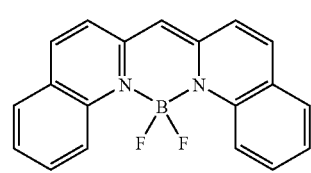

FD 53

-continued

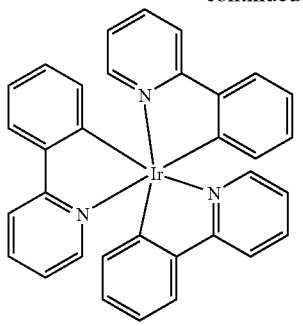

PD 1 (Ir(PPY)₃)

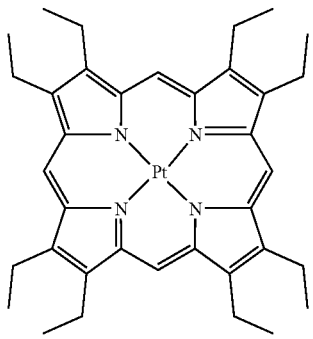

PD 2

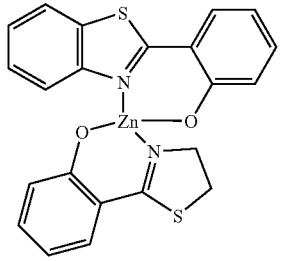

PD 3

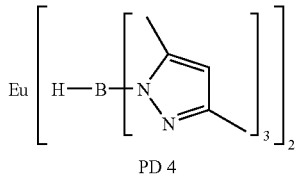

PD 4

Electron-Transporting Layer (ETL):

Preferred thin film-forming materials for use in forming the electron-transporting layer 111 of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Triazines are also known to be useful as electron transporting materials. Oxadiazole compounds including small molecules and polymers are useful electron transporting materials as described in U.S. Pat. No. 6,451,457.

Cathode

When light emission is viewed solely through the anode, the cathode 113 used in this invention can include nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459, 6,278,236, and 6,284,393; JP 3,234,963 and EP 1 076 368. Cathode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Other Useful Organic Layers and Device Architecture

In some instances, layers 109 and 111 can optionally be collapsed into a single layer that serves the function of supporting both light emission and electron transportation, or layers 107 and 109 can optionally be collapsed into a single layer that serves the function of supporting both light emission and hole transportation. Alternatively, layers 107, 109 and 111 can optionally be collapsed into a single layer that serves the function of supporting both light emission and hole and electron transportation. This is the preferred EL device structure of this invention and is referred to as "single-layer" device.

It also known in the art that emitting dopants may be added to the hole-transporting layer, which may serve as a host. Multiple dopants may be added to one or more layers in order to create a white-emitting EL device, for example, by combining blue- and yellow-emitting materials, cyan- and red-emitting materials, or red-, green-, and blue-emitting materials. White-emitting devices are described, for example, in EP 1 187 235, EP 1 182 244, U.S. Patent Application Publication No. 20020025419; U.S. Pat. Nos. 5,683,823; 5,503,910; 5,405,709, and 5,283,182.

Additional layers such as electron or hole-blocking layers as taught in the art may be employed in devices of this invention. Hole-blocking layers are commonly used to improve efficiency of phosphorescent emitter devices, for example, as in U.S. Patent Application Publication No. 20020015859.

This invention may be used in so-called stacked device architecture, for example, as taught in U.S. Pat. Nos. 5,703, 436 and 6,337,492.

Deposition of Organic Layers

The organic materials mentioned above can be deposited as high quality transparent thin films by various methods such as a vapor deposition or sublimation method, an electron-beam method, a sputtering method, a thermal transferring method, a molecular lamination method and a coating method such as solution casting, spin-coating or inkjet printing, with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237, 529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294, 870), spatially-defined thermal dye transfer from a donor sheet (U.S. Pat. Nos. 5,688,551; 5,851,709 and 6,066,357) and inkjet method (U.S. Pat. No. 6,066,357).

Preferably, the spin-coating or inkjet printing technique is used to deposit the conjugated polymer of the invention, and only one polymer is deposited in a single layer device.

Encapsulation:

Most organic EL devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization:

Organic EL devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

EXAMPLES

The invention and its advantages are further illustrated by the following specific examples:

Synthesis of Monomers

The monomers to be used in the present invention to construct polymers are not necessary to be particularly restricted. Any monomers can be used as long as the polymer formed is a polymer which satisfies the general formulas (II) and (III). Typical synthesis is illustrated in Schemes 1-4.

Example

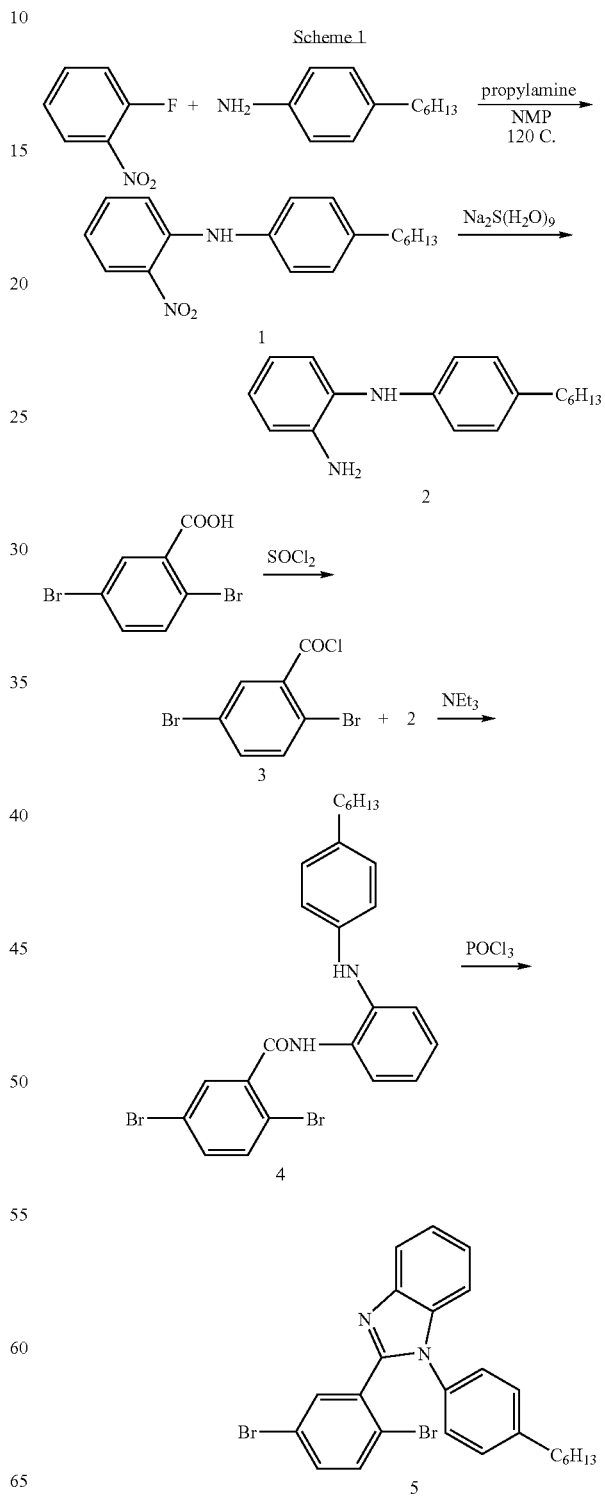

Scheme 2
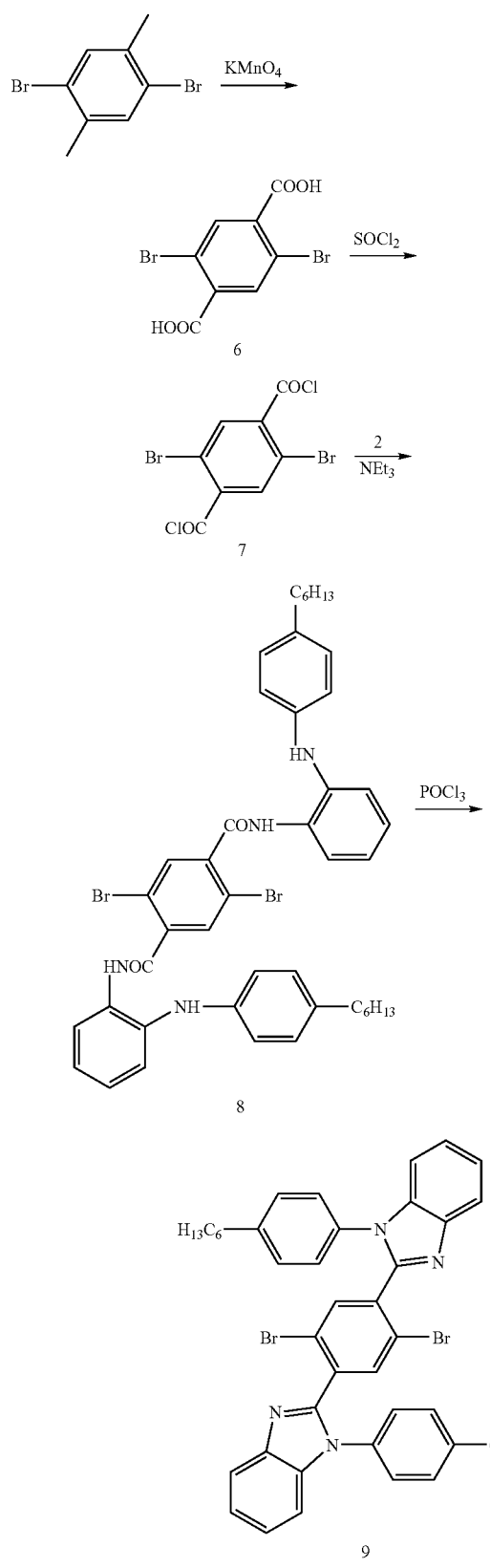
Scheme 3
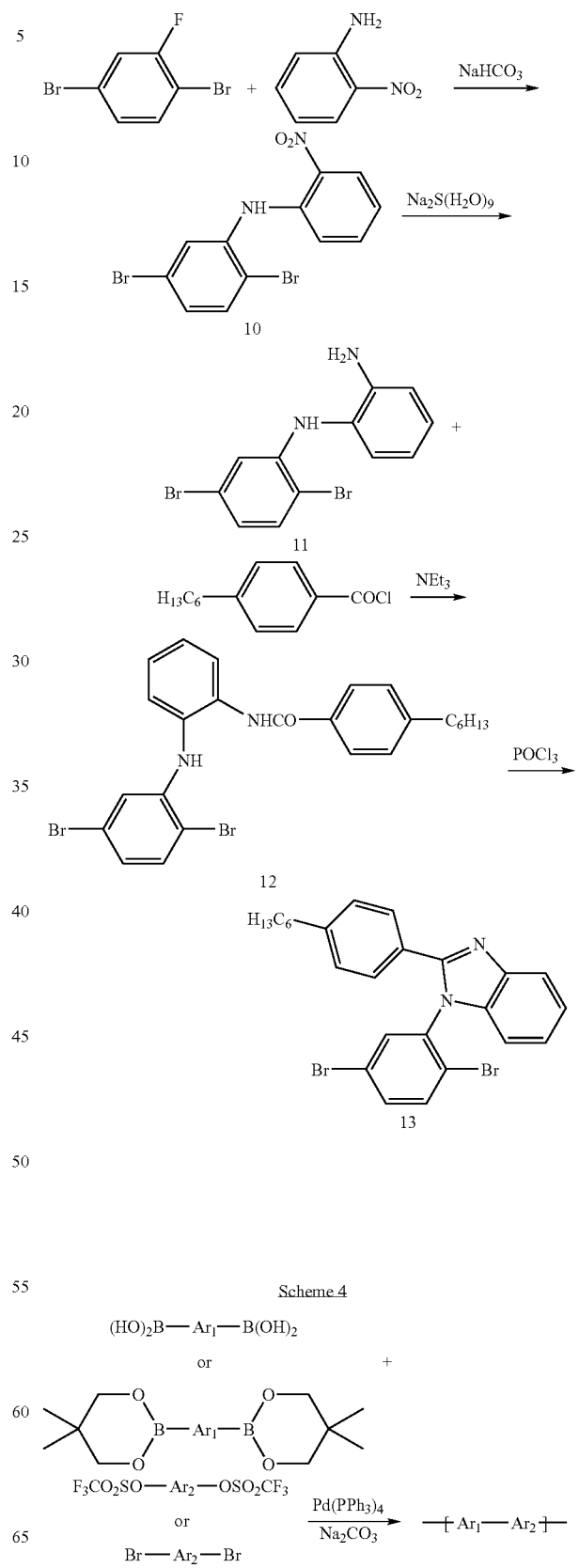
Scheme 4
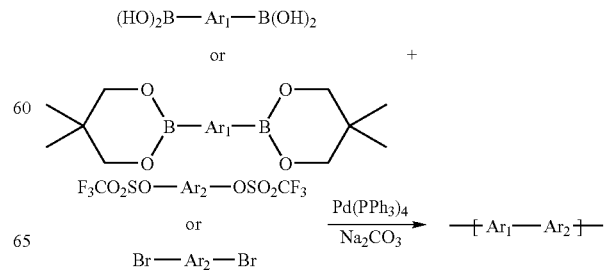

Example 1

Synthesis of Compound 1

To a 500 mL round-bottom flask were added 2-fluoronitrobenzene (16.0 g, 0.11 mol), 4-hexylaniline (23.7 g, 0.13 mol), tripropylamine (20.7 g, 0.14 mol), and 150 mL of NMP. The reaction was heated to 120° C. overnight under nitrogen. After cooling down to room temperature, the reaction mixture was extracted with methylene chloride and water, and the combined organic phase was washed 3 times with water. The crude product was obtained as brown oil and was purified by column chromatography on silica gel using petroleum ether as an eluent to give 31.4 g of pure product as orange-red oil (93% yield). $^1$H NMR (CDCl$_3$) δ (ppm): 0.90 (t, J=6.8 Hz, 3 H), 1.26-1.38 (m, 6 H), 1.60-1.65 (m, 2 H), 2.62 (t, J=7.7 Hz, 2 H), 6.70-6.76 (m, 1 H), 7.15-7.25 (m, 5 H), 7.31-7.58 (m, 1 H), 8.19 (dd, J$_1$=8.6 Hz, J$_2$=1.4 Hz, 1 H), 9.46 (s, br, 1 H); $^{13}$C NMR (CDCl$_3$) δ (ppm): 14.08, 22.59, 28.94, 31.42, 31.69, 35.45, 115.96, 117.04, 124.66, 126.58, 129.60, 132.80, 135.61, 136.031, 140.78, 143.62; FD-MS: m/z 298 (M$^+$).

Example 2

Synthesis of Compound 2

Compound 1 (17.5 g, 0.059 mol) and sodium sulfide nonahydrate (42.0 g, 0.18 mol) were added to 150 mL of ethanol. The reaction mixture was heated to reflux for 9 hours. After the removal of the solvent, the residue was extracted with water and methylene chloride. The crude product was recrystallized from petroleum ether to give 13.3 g of white flaky crystals (84% yield). $^1$H NMR (CDCl$_3$)δ (ppm): 0.88 (t, J=6.1 Hz, 3 H), 1.29-1.56 (m, 8 H), 2.51 (t, J=7.6 Hz, 2 H), 3.64 (s, br, 2 H), 5.07 (s, br, 1 H), 6.65-6.77 (m, 4 H), 6.94-7.09 (m, 4 H); $^{13}$C NMR (CDCl$_3$)δ(ppm): 14.21, 22.70, 29.07, 31.80, 35.17,.53, 116.00, 119.03, 123.78, 124.94, 129.00, 129.25, 133.95, 141.19, 142.65; M.p. 66-67° C.; FD-MS: m/z 268 (M$^+$).

Example 3

Synthesis of Compound 3

2,5-Dibromobenzoic acid (15.0 g, 0.054 mol) was heated to reflux in 20 mL of thionyl chloride (32.7 g, 0.28 mol) overnight. The solid dissolved slowly upon heating and the reaction turned into a light yellow solution. Excess of thionyl chloride was distilled off and the solid residue was recrystallized from dry hexane to give 14.1 g of pure product as off-white solid (88% yield). $^1$H NMR (CDCl$_3$)δ(ppm): 7.55 (d, J=2.1 Hz, 1 H), 7.56 (s, 1 H), 8.13 (d, J=2.1 Hz, 1 H); $^{13}$C NMR (CDCl$_3$)δ(ppm): 119.86, 121.12, 135.42, 135.92, 136.26, 137.04; M.p. 119-120° C.

Example 4

Synthesis of Compound 4

Compound 2 (5.0 g, 0.019 mol) was dissolved in 50 mL of methylene chloride and cooled to 0° C. To the solution was added triethylamine (2.0 g, 0.020 mol) and compound 3 (5.6 g, 0.019 mol). The reaction was stirred at room temperature overnight, extracted with water, and dried over MgSO$_4$. The crude product was obtained as 9.5 g of off-white solid (96% yield) and was used without purification. $^1$H NMR (CDCl$_3$)δ(ppm): 0.88 (t, J=6.7 Hz, 3 H), 1.26-1.36 (m, 6 H), 1.51-1.59 (m, 2 H), 2.52 (t, J=7.7 Hz, 2 H), 5.54 (s, br, 1 H), 6.72 (d, J=8.3 Hz, 2 H), 7.03 (d, J=8.3 Hz, 2 H), 7.13-7.16 (m, 2 H), 7.22-7.25 (m, 1 H), 7.33-7.42 (m, 2 H), 7.46 (d, J=2.1 Hz, 1 H), 8.02-8.06 (m, 1 H), 8.13 (s, br, 1 H); $^{13}$C NMR (CDCl$_3$)δ(ppm): 14.09, 22.60, 28.97, 31.62, 31.72, 35.15, 116.80, 118.08, 121.52, 122.84, 123.35, 124.43, 126.20, 129.27, 130.89, 132.32, 134.42, 134.65, 134.81, 135.50, 139.13, 142.13, 164.36; M.p. 120-121° C.; FD-MS: m/z 530 (M$^+$).

Example 5

Synthesis of Compound 5

Compound 4 (9.2 g, 0.017 mol) was heated to reflux in 10 mL of POCl$_3$ (16.5 g, 0.11 mol) overnight. Excess POCl$_3$ was distilled off and the residue was extracted with ethyl acetate and water. The crude product was obtained as a light brown foam and was purified by column chromatography on silica gel using ethyl acetate/petroleum ether (8/92 v/v) as an eluent to give 7.2 g of pure product as viscous oil that solidified upon standing (81% yield). $^1$H NMR (CDCl$_3$)δ (ppm): 0.88 (t, J=6.7 Hz, 3 H), 1.28-1.34 (m, 6 H), 1.57-1.64 (m, 2 H), 2.62 (t, J=7.8 Hz, 2 H), 7.14-7.39 (m, 9 H), 7.63 (s, 1 H), 7.91 (J=7.8 Hz, 1 H); $^{13}$C NMR (CDCl$_3$)δ(ppm): 14.02, 22.50, 28.79, 30.99, 31.56, 35.45, 110.76, 120.17, 120.78, 122.41, 123.12, 123.85, 126.34, 129.34, 132.98, 134.07, 134.09, 135.25, 135.64, 142.33, 143.35, 149.98; M.p. 64-65° C.; FD-MS: m/z 512 (M$^+$).

Example 6

Synthesis of Compound 6

2,5-Dibromo-p-xylene (35 g, 0.13 mol) and potassium permanganate (210 g, 1.32 mol) were mixed in 1.2 L of water. The reaction was heated to reflux for 2 days until the purple color of permanganate disappeared. The reaction was cooled and filtered through a pad of Celite. The filtrate was cooled in an ice-bath and neutralized by concentrated HCl solution until pH~1. The white crystalline product was filtered, washed with water, and dried over P$_2$O$_5$. $^1$H NMR (DMSO)δ(ppm): 5.06 (s, br, 2 H), 8.02 (s, 2 H); M.p. 178-180° C.; FD-MS: m/z 324 (M$^+$).

Example 7

Synthesis of Compound 7

Compound 6 (19.2 g, 0.059 mol) was suspended in 30 mL of thionyl chloride and heated to reflux. Large amount of gas evolved in first 20 min. and the reaction became clear. The reaction was refluxed for 4 h and the excess of thionyl chloride was distilled off. To the light yellow residue was added dry hexane and the mixture was heated to reflux until all solid dissolved. The solution was cooled down and white crystals formed. The crystals were filtered off, washed with dry hexane, and dried under vacuum at room temperature overnight to give 19.2 g product as white solid at 90% yield. $^1$H NMR (CDCl$_3$)δ(ppm): 8.21 (s, 2 H); $^{13}$C NMR (CDCl$_3$) δ(ppm): 119.30, 137.10, 139.64, 164.28; Mp 80-82° C.

Example 8

Synthesis of Compound 8

Compound 2 (7.5 g, 0.028 mol) was dissolved in 150 mL of methylene chloride and cooled to 0° C. To the solution was added triethylamine (3.1 g, 0.031 mol) and compound 7 (5.0 g, 0.014 mol). The reaction was stirred at room temperature overnight. Large amount of precipitate formed. The precipitate was filtered and washed with water and ethyl acetate. The filtrate was extracted with ethyl acetate, and dried over $MgSO_4$. Solvent was removed and the residue was combined with the yellow precipitate to give total 8.5 g of crude product (74% yield) and was used without purification. $^1$H NMR (DMSO)δ(ppm): 0.84 (t, J=6.7 Hz, 6 H), 1.26-1.36 (m, 16 H), 1.52-1.60 (m, 4 H), 6.82 (d, J=8.3 Hz, 4 H), 6.95-6.97 (m, 2 H), 7.03 (d, J=8.3 Hz, 4 H), 7.13-7.16 (m, 2 H), 7.22-7.23 (m, 2 H), 7.56 (d, J=2.1 Hz, 2 H), 7.66 (s, 2 H), 10.01 (s, 1 H); $^{13}$C NMR (DMSO)δ(ppm): 13.94, 22.07, 28.33, 31.06, 31.14, 34.48, 117.03, 118.22, 119.34, 120.89, 126.32, 126.44, 127.63, 128.82, 132.55, 132.61, 133.78, 137.42, 141.39, 164.27; M.p. 239-240° C.; FD-MS: m/z 824 ($M^+$).

Example 9

Synthesis of Compound 9

Compound 8 (8.3 g, 0.010 mol) was heated to reflux in 20 mL of $POCl_3$ (32.9 g, 0.22 mol) overnight. The starting material did not dissolve completely and after overnight refluxing, the reaction turned into brown purple with gray precipitate. Excess $POCl_3$ was distilled off and the residue was suspended in ethyl acetate and water. The precipitate was filtered and washed with ethyl acetate to give 8.5 g of crude product as white powder. The crude product was purified by column chromatography on silica gel using ethyl acetate/methylene chloride (10/90 v/v) as an eluent to give 7.0 g of pure product as off-white powder (88% yield). $^1$H NMR ($CDCl_3$)δ(ppm): 0.90 (t, J=6.8 Hz, 6 H), 1.26-1.40 (m, 12 H), 1.62-1.69 (m, 4 H), 2.66 (t, J=7.8 Hz, 4 H), 7.14 (d, J=8.3 Hz, 4 H), 7.23 (d, J=8.3 Hz, 4 H), 7.32-7.40 (m, 6 H), 7.67 (s, 2 H), 7.88 (d, J=8.2 Hz, 2 H); $^{13}$C NMR ($CDCl_3$) δ(ppm): 11.97, 20.16, 26.55, 28.83, 29.20, 32.97, 108.74, 117.78, 120.90, 121.86, 124.46, 127.28, 130.66, 132.50, 133.12, 133.47, 134.18, 140.36, 140.88; M.p. 215-217° C.; FD-MS: m/z 788 ($M^+$).

Example 10

Synthesis of Compound 10

2-Nitroaniline (12.2 g, 0.089 mol) and 2-fluoro-1,4-dibromobenzene (33.7 g, 0.13 mol) was dissolved in 100 mL of DMF. To this solution was added sodium bicarbonate (14.0 g, 0.17 mol). The reaction was degassed with nitrogen and heated to 150° C. for 2 days. Large amount of 2-nitroaniline was still present, but no 2-fluoro-1,4-dibromobenzene was observed on TLC. After cooling down, the reaction was extracted with water and methylene chloride, and the combined organic phase was back-washed with water 3 times. The crude product was purified by column chromatography on silica gel using petroleum ether as an eluent and then recrystallized from heptane to give 1.5 g of pure product as orange solid (4.5% yield). $^1$H NMR ($CDCl_3$)δ(ppm): 6.91-6.96 (m, 1 H), 7.17 (dd, $J_1$=8.5 Hz, $J_2$=2.2 Hz, 1 H), 7.25-7.28 (m, 1 H), 7.46-7.54 (m, 2 H), 7.59 (d, J=2.2 Hz, 1 H), 8.23 (dd, $J_1$=8.5 Hz, $J_2$=1.3 Hz, 1H); $^{13}$C NMR ($CDCl_3$)δ(ppm): 116.56, 116.86, 119.45, 119.52, 121.48, 125.77, 126.81, 128.68, 128.78, 134.70, 135.71, 140.18; M.p. 166-168° C.; FD-MS: m/z 370 ($M^+$).

Example 11

Synthesis of Compound 11

Compound 10 (1.3 g, 3.5 mmol) and sodium sulfide nonahydrate (2.5 g, 0.10 mol) were added to 10 mL of ethanol. The reaction mixture was heated to reflux for 1 hours and then poured into cold water. The precipitate was filtered and washed with water and dried to give 0.80 g of crude product as light yellow solid (68% yield). $^1$H NMR ($CDCl_3$)δ(ppm): 3.80 (s, br, 2 H), 5.72 (s, br, 1 H), 6.64 (d, J=2.1 Hz, 1 H), 6.75-6.84 (m, 3 H), 7.08-7.14 (m, 2 H), 7.32 (d, J=8.4 Hz, 1 H); $^{13}$C NMR ($CDCl_3$)δ(ppm): 116.22, 116.44, 119.10, 122.18, 122.23, 127.45, 127.73, 133.46; M.p. 106-107° C.; FD-MS: m/z 340 ($M^+$).

Example 12

Synthesis of Compound 12

Compound 11 (0.60 g, 1.8 mmol) was dissolved in 10 mL of methylene chloride and cooled to 0° C. To the solution was added triethylamine (0.21 g, 2.1 mmol) and 4-hexylbenzoyl chloride (0.39 g, 1.8 mmol). The reaction was stirred at room temperature for 2 hours. Some precipitate formed. The reaction was extracted with water, and dried over $MgSO_4$. Solvent was removed and the residue was recrystallized from heptane to give 0.68 g off-white crystals. $^1$H NMR ($CDCl_3$)δ(ppm): 0.93 (t, J=6.6 Hz, 3 H), 1.31-1.40 (m, 6 H), 1.61-1.68 (m, 2 H), 2.69 (t, J=7.7 Hz, 2 H), 6.23 (s, br, 1 H), 6.82 (d, J=2.2 Hz, 1 H), 6.87 (dd, $J_1$=8.4 Hz, $J_2$=2.2 Hz, 1 H), 7.23-7.31 (m, 3 H), 7.35 (d, J=7.5 Hz, 2 H), 7.40 (d, J=8.3 Hz, 1 H), 7.72 (d, J=8.2 Hz, 2 H), 8.26 (d, J=8.0 Hz, 1 H), 8.34 (s, br 1 H); $^{13}$C NMR ($CDCl_3$)δ(ppm): 14.06, 22.55, 28.90, 31.10, 31.63, 35.84, 109.73, 117.26, 122.52, 123.33, 125.54, 126.35, 127.10, 128.83, 131.07, 133.78, 133.99, 147.57, 165.79; M.p. 128-129° C.; FD-MS: m/z 528 ($M^+$).

Example 13

Synthesis of Compound 13

Compound 12 (0.68 g, 1.3 mmol) was refluxed in 0.6 mL of $POCl_3$ (1.0 g, 6.4 mmol) for 30 minutes. Excess $POCl_3$ was distilled off and the residue was extracted with ethyl acetate and water. The crude product was purified by column chromatography on silica gel using ethyl acetate/petroleum ether (10/90 v/v) as an eluent to give 0.5 g of pure product as light greenish solid (77% yield). $^1$H NMR ($CDCl_3$)δ (ppm): 0.87 (t, J=6.6 Hz, 3 H), 1.26-1.32 (m, 6 H), 1.55-1.62 (m, 2 H), 2.60 (t, J=7.6 Hz, 2 H), 7.00 (d, J=7.9 Hz, 1 H), 7.14 (d, J=8.1 Hz, 2 H), 7.24-7.29 (m, 1 H), 7.32-7.37 (m, 1 H), 7.49-7.53 (m, 4 H), 7.63 (d, J=8.2 Hz, 1 H), 7.88 (d, J=7.9 Hz, 1 H); $^{13}$C NMR ($CDCl_3$)δ(ppm): 14.05, 22.55, 28.84, 30.95, 31.62, 35.73, 110.29, 119.90, 121.73, 123.20, 123.32, 123.44, 128.45, 128.50, 128.62, 128.81, 133.31, 133.82, 135.11, 145.01; M.p. 156-158° C.; FD-MS: m/z 510 ($M^+$)

Synthesis of Polymers

Example 14

General Procedure for Synthesis of Polymers Via the Suzuki Coupling Reaction Equal molar of aromatic di-bromide or di-triflate and aromatic di-boron compound, and phase transfer reagent Aliquat® 336 (0.10 equivalent to monomer) were dissolved in of toluene (the ratio of toluene to water (v/v) is about 3/1). To this solution was added 2 M $Na_2CO_3$ aqueous solution (3.3 equivalent to monomer). The reaction mixture was bubbled with dry nitrogen for 15 min and catalyst tetrakis(triphenylphosphine)palladium (0.03 equivalent to monomer) was added. The reaction was heated under vigorous reflux for 12-24 h, and small amount of phenylboronic acid was added for end-capping of bromo or triflate group. The reaction was heated for 5 h and bromobenzene was added to end-cap boron group. The reaction was heated for another 4 h and then poured into methanol. The precipitated polymer was washed with methanol, diluted HCl solution, and dried. The polymer was treated with diethyl dithiocarbamate twice: polymer was dissolved in toluene, and sodium diethyl dithiocarbamate in water (1 g in 10 mL of water) was added, and the mixture was stirred under nitrogen at 60° C. overnight. The toluene layer was separated, washed with water twice, and concentrated, and the polymer was precipitated into methanol twice. Polymer can then be extracted with acetone with a Sohxlet setup overnight to remove oligomers. Polymer was dried under vacuum at 45° C.

EL Device Fabrication and Performance

Example 15

An EL device satisfying the requirements of the invention was constructed in the following manner. The organic EL medium has a single layer of the organic compound described in this invention.

a) An indium-tin-oxide (ITO) coated glass substrate was sequentially ultra-sonicated in a commercial detergent, rinsed with deionized water, degreased in toluene vapor and exposed to ultraviolet light and ozone for a few minutes.

b) An aqueous solution of PEDOT (1.3% in water, Baytron P Trial Product AI 4083 from H. C. Stark) was spin-coated onto ITO under a controlled spinning speed to obtain thickness of 500 Angstroms. The coating was baked in an oven at 110° C. for 10 min.

c) A toluene solution of a polymer (300 mg in 30 mL of solvent), or a polymer with dopant(s) (dopant(s) are 4 wt % to polymer, for example, PD 1 $Ir(PPY)_3$ was used) was filtered through a 0.2 μm Teflon filter. The solution was then spin-coated onto PEDOT under a controlled spinning speed. The thickness of the film was between 500-1000 Angstroms.

d) On the top of the organic thin film was deposited a cathode layer consisting of 15 angstroms of a CsF salt, followed by a 2000 angstroms of a 10:1 atomic ratio of Mg and Ag.

The above sequence completed the deposition of the EL device. The device was then hermetically packaged in a dry glove box for protection against ambient environment.

Figure 2:
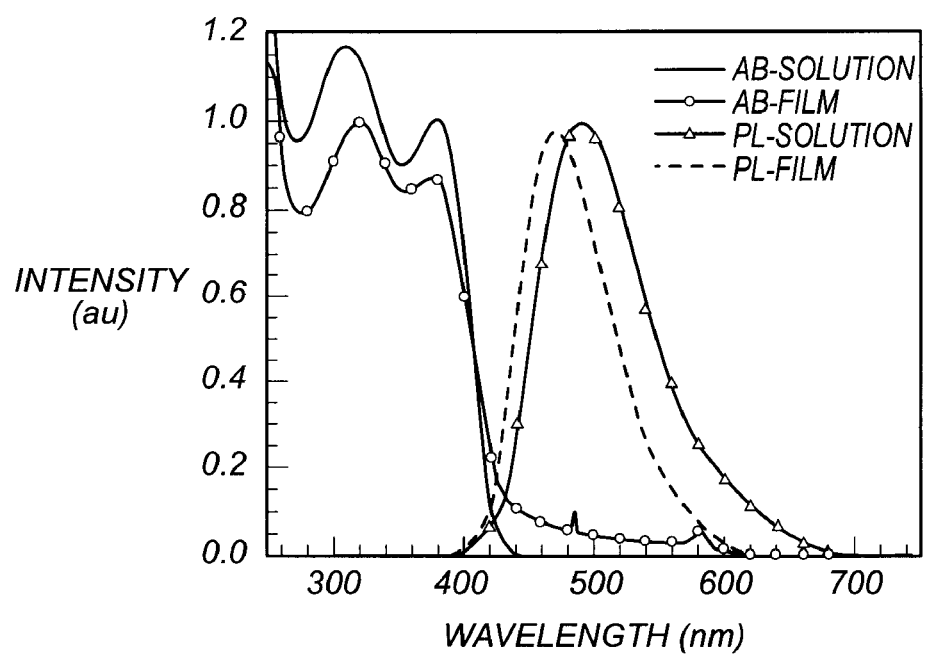
FIG. 2 illustrates the absorption (AB) and photoluminescence (PL) spectra of polymer 43 in solution and thin film.
Figure 3:
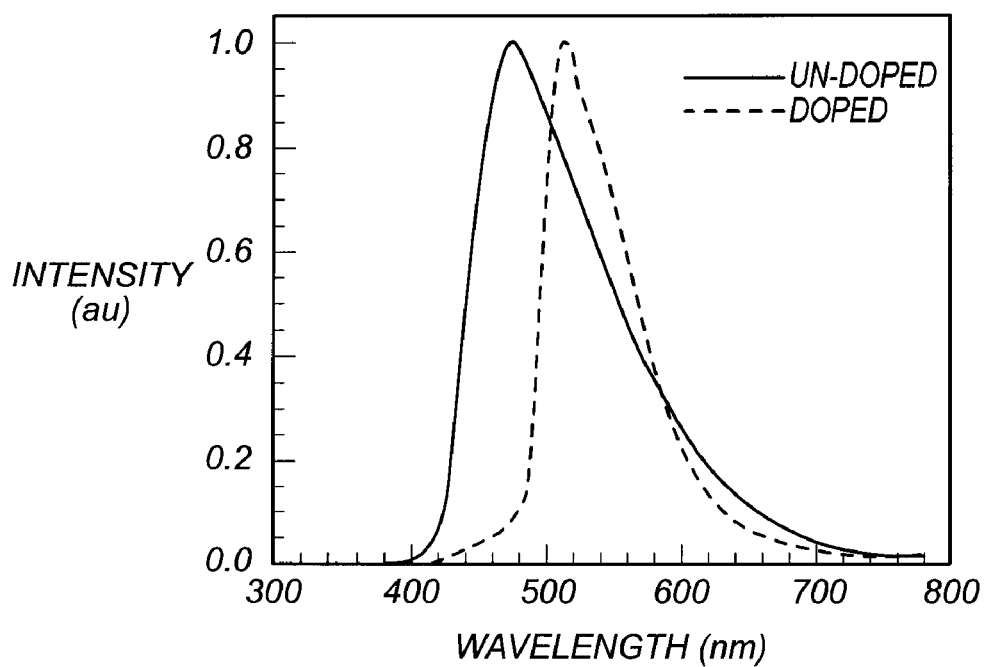
FIG. 3 illustrates the EL spectra of the two EL devices fabricated from polymer 43: ITO/PEDOT/polymer 43/CsF/Mg:Ag and ITO/PEDOT/polymer 43+4 wt % Ir(PPY)$_3$/CsF/Mg:Ag.
Figure 4:
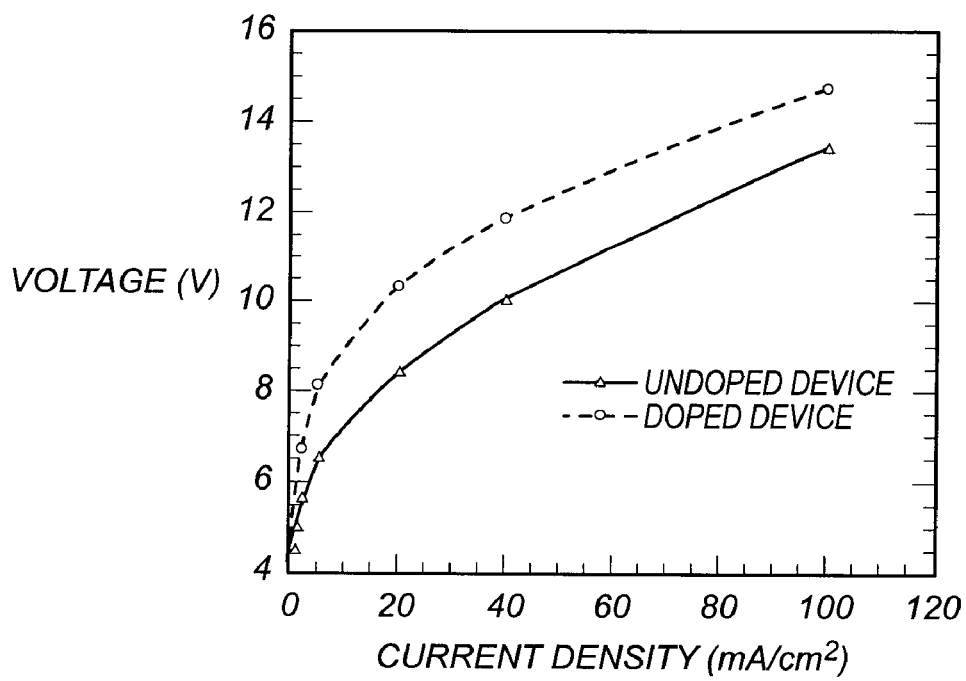
FIG. 4 illustrates the voltage-current density of the two EL devices fabricated from polymer 43 and polymer 43 doped with Ir(PPY)$_3$.

Table 1 summarizes the characterization of the polymers prepared in the present invention. Absorption (AB) and photoluminescence (PL) spectra were obtained from solid thin films of the polymers and EL spectra were obtained from ITO/PEDOT/organic material/CsF/Mg:Ag EL devices. The fabrication of EL devices was illustrated in Example 15. FIG. 2 shows the AB and PL spectra of polymer 43 in dilute toluene solution and thin film. FIG. 3 shows the EL spectra of devices from polymer 43 and polymer 43 doped with $Ir(PPY)_3$: ITO/PEDOT/polymer 43/CsF/Mg:Ag and ITO/PEDOT/polymer 43+4 wt % $Ir(PPY)_3$/CsF/Mg:Ag EL. And FIG. 4 shows the voltage-current characteristics of the doped and un-doped EL devices of polymer 43.

TABLE 1

Characterization of polymers according to Examples.

| Polymer | $M_w{}^a$ | PDI | $T_d$ (° C.) | $T_g$ (° C.) | $AB^b$ ($\lambda_{max}$ nm) | $PL^c$ ($\lambda_{max}$ nm) | EL ($\lambda_{max}$ nm) |
|---|---|---|---|---|---|---|---|
| 5 | $NA^d$ | NA | 453 | 141 | 340 | 412 (342) | 500 |
| 12 | NA | NA | 453 | 153 | 308 | 410 (310) | NA |
| 24 | 4740 | 1.33 | 433 | 160 | 326 | 406 (332) | NA |
| 43 | 4930 | 1.26 | 466 | 171 | 320 | 474 (380) | 472 |
| 75 | 8470 | 1.42 | 492 | 155 | 378 | 428 (380) | 460 |
| 90 | 3510 | 1.31 | 455 | 136 | 304 | 438 (306) | 452 |
| 102 | 2570 | 1.41 | 452 | 131 | 302 | 442 (304) | 456 |

$^a$weight average molecular weight, determined by size exclusion chromatography in THF using polystyrene standard.
$^b$as solid state thin film
$^c$as solid state thin film, the number in the parenthesis is the excitation wavelength
$^d$not available.

The entire contents of the patents and other publications referred to in this specification are incorporated herein by reference.

The invention has been described in detail with particular reference to certain preferred embodiments thereof, but it will be understood that variations and modifications can be effected within the spirit and scope of the invention.

PARTS LIST

101 Substrate
103 Anode
105 Hole-Injecting layer (HIL)
107 Hole-Transporting layer (HTL)
109 Light-Emitting layer (LEL)
111 Electron-Transporting layer (ETL)
113 Cathode
250 Current/Voltage source
260 Electrical conductors

The invention claimed is:

1. An electroluminescent device, comprising
a) a spaced-apart anode and cathode; and
b) an organic layer disposed between the spaced-apart anode and cathode and including a conjugated polymer having an azole structure represented by formula (I)

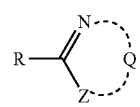

(I)

wherein:
Z is NR', or S;

Q represents atoms necessary to complete a hetero ring with N and Z;

R is a substituent and selected from hydrogen, or alkyl, or alkenyl, or alkynyl, or alkoxy wherein the alkyl, alkenyl, alkynyl or alkoxy can have from 1 to 40 carbon atoms; or aryl from 6 to 60 carbon atoms; or heteroaryl from 4 to 60 carbons; or F, or Cl, or Br; or a cyano group; or a nitro group; or atoms coupled to N or Z to complete a fused aromatic or heteroaromatic ring; and R' is hydrogen, or alkyl, or alkenyl, or alkynyl of from 1 to 40 carbon atoms wherein the alkyl, alkenyl, alkynyl or alkoxy can have from 1 to 40 carbon atoms; aryl from 6 to 60 carbon atoms; or heteroaryl from 4 to 60 carbons; or F, or Cl, or Br and wherein the conjugated polymer including formula (I) is represented by the repeating unit of formula (III)

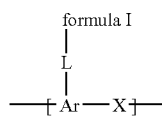

(III)

wherein:

X is a conjugated group of 2 to 60 carbon atoms;

Ar is an aryl group having 6 to 60 carbon atoms; or heteroaryl having 4 to 60 carbon atoms, and one or more N, S, or O atoms; and L is a direct bond between Formula (I) and Ar or a carbon linking group having 1 to 40 carbon atoms or a non-carbon linking group having 0 to 40 carbon atoms.

2. The electroluminescent device of claim 1 wherein the organic layer is an emissive layer or an electron transport layer or both.

3. The electroluminescent device of claim 1 wherein X includes arylenes.

4. The electroluminescent device of claim 1 wherein L includes an aryl group.

5. A method of making an electroluminescent device, comprising a) providing a spaced-apart anode and cathode; and b) depositing an organic layer between the spaced-apart anode and cathode and including a conjugated polymer having an azole structure represented formula (I)

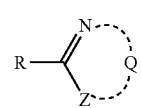

(I)

wherein:

Z is NR', or S;

Q represents atoms necessary to complete a hetero ring with N and Z;

R is a substituent and selected from hydrogen, or alkyl, or alkenyl, or alkynyl, or alkoxy wherein the alkyl, alkenyl, alkynyl or alkoxy can have from 1 to 40 carbon atoms; or aryl from 6 to 60 carbon atoms; or heteroaryl from 4 to 60 carbons; or F, or Cl, or Br; or a cyano group; or a nitro group; or atoms coupled to N or Z to complete a fused aromatic or heteroaromatic ring; and R' is hydrogen, or alkyl, or alkenyl, or alkynyl of from 1 to 40 carbon atoms wherein the alkyl, alkenyl, alkynyl or alkoxy can have from 1 to 40 carbon atoms; aryl from 6 to 60 carbon atoms; or heteroaryl from 4 to 60 carbons; or F, or Cl, or Br and wherein the conjugated polymer including formula (I) is represented by the repeating unit of formula (III)

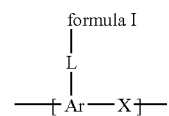

(III)

wherein:

X is a conjugated group of 2 to 60 carbon atoms;

Ar is an aryl group having 6 to 60 carbon atoms; or heteroaryl having 4 to 60 carbon atoms, and one or more N, S, or O atoms; and L is a direct bond between Formula (I) and Ar or a carbon linking group having 1 to 40 carbon atoms or a non-carbon linking group having 0 to 40 carbon atoms.

6. The electroluminescent device of claim 5 wherein the organic layer is an emissive layer or an electron transport layer or both.

7. The electroluminescent device of claim 1 wherein L includes atoms.

* * * * *